(12) United States Patent
Yokogawa et al.

(10) Patent No.: US 8,604,591 B2
(45) Date of Patent: Dec. 10, 2013

(54) NITRIDE-TYPE SEMICONDUCTOR ELEMENT AND PROCESS FOR PRODUCTION THEREOF

(75) Inventors: Toshiya Yokogawa, Nara (JP); Ryou Kato, Osaka (JP); Naomi Anzue, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/412,618

(22) Filed: Mar. 6, 2012

(65) Prior Publication Data

US 2012/0168811 A1 Jul. 5, 2012

Related U.S. Application Data

(63) Continuation of application No. PCT/JP2011/002489, filed on Apr. 27, 2011.

(30) Foreign Application Priority Data

Apr. 28, 2010 (JP) ................................. 2010-104364

(51) Int. Cl.
*H01L 21/02* (2006.01)
*H01L 29/207* (2006.01)
*H01L 33/00* (2010.01)

(52) U.S. Cl.
USPC ............................. 257/611; 257/99; 257/609

(58) Field of Classification Search
USPC ............... 257/99, 745, 748, 94, 76, 192, 609, 257/611, E21.09, E29.091, E29.242
See application file for complete search history.

(56) References Cited

U.S. PATENT DOCUMENTS

| 5,990,500 | A | * | 11/1999 | Okazaki ........................... 257/99 |
| 7,732,837 | B2 | * | 6/2010 | Saito et al. .................... 257/195 |
| 2004/0026702 | A1 | | 2/2004 | Yamada et al. |
| 2008/0048194 | A1 | | 2/2008 | Kudo et al. |
| 2008/0048195 | A1 | | 2/2008 | Okuyama et al. |
| 2011/0037088 | A1 | | 2/2011 | Oya et al. |
| 2011/0156048 | A1 | | 6/2011 | Yokogawa et al. |

FOREIGN PATENT DOCUMENTS

| JP | 08-064871 A | 3/1996 |
| JP | 2001-308462 A | 11/2001 |
| JP | 2003-332697 A | 11/2003 |
| JP | 2006-024713 A | 1/2006 |

(Continued)

OTHER PUBLICATIONS

International Search Report for corresponding International Application No. PCT/JP2011/002489 mailed Jul. 26, 2011.

(Continued)

*Primary Examiner* — Walter H Swanson
*Assistant Examiner* — Wilner Jean Baptiste
(74) *Attorney, Agent, or Firm* — Renner, Otto, Boisselle & Sklar, LLP

(57) ABSTRACT

A nitride-based semiconductor device includes a p-type $Al_dGa_eN$ layer 25 whose growing plane is an m-plane and an electrode 30 provided on the p-type $Al_dGa_eN$ layer 25. The $Al_dGa_eN$ layer 25 includes a p-$Al_dGa_eN$ contact layer 26 that is made of an $Al_xGa_yIn_zN$ (x+y+z=1, x≥0, y>0, z≥0) semiconductor, which has a thickness of not less than 26 nm and not more than 60 nm. The p-$Al_dGa_eN$ contact layer 26 includes a body region 26A which contains Mg of not less than $4\times10^{19}$ $cm^{-3}$ and not more than $2\times10^{20}$ $cm^{-3}$ and a high concentration region 26B which is in contact with the electrode 30 and which has a Mg concentration of not less than $1\times10^{21}$ $cm^{-3}$.

13 Claims, 10 Drawing Sheets

(56) References Cited

FOREIGN PATENT DOCUMENTS

| | | |
|---|---|---|
| JP | 2007-081368 A | 3/2007 |
| JP | 2008-153285 A | 7/2008 |
| JP | 2008-277539 A | 11/2008 |
| JP | 4486701 B | 4/2010 |
| JP | 4568379 B | 8/2010 |
| WO | 03/007390 A1 | 1/2003 |

OTHER PUBLICATIONS

Form PCT/ISA/237 for corresponding International Application No. PCT/JP2011/002489 dated Jul. 26, 2011 and Partial English translation.

* cited by examiner

SAMPLE
No.1

$3.7 \times 10^{-2} \, (\Omega \, cm^2)$

SAMPLE
No.2

$7.1 \times 10^{-3} \, (\Omega \, cm^2)$

SAMPLE
No.3

$2.0 \times 10^{-3} \, (\Omega \, cm^2)$

SAMPLE No.4

$1.6 \times 10^{-3} \, (\Omega \, cm^2)$

SAMPLE No.5

$1.1 \times 10^{-3} \, (\Omega \, cm^2)$

US 8,604,591 B2

NITRIDE-TYPE SEMICONDUCTOR ELEMENT AND PROCESS FOR PRODUCTION THEREOF

This is a continuation of International Application No. PCT/JP2011/002489, with an international filing date of Apr. 27, 2011, which claims priority of Japanese Patent Application No. 2010-104364, filed on Apr. 28, 2010, the contents of which are hereby incorporated by reference.

TECHNICAL FIELD

The present disclosure relates to a nitride-based semiconductor device and a method for fabricating such a device.

BACKGROUND ART

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors" and which are represented by the formula $Al_xGa_yIn_zN$ (where $0 \leq x, y, z \leq 1$ and $x+y+z=1$)) have been researched and developed particularly extensively. As a result, blue light-emitting diodes (LEDs), green LEDs, and semiconductor laser diodes made of GaN-based semiconductors have already been used in actual products (see Patent Documents 1 and 2, for example). A GaN-based semiconductor has a wurtzite crystal structure. FIG. 1 schematically illustrates a unit cell of GaN. In an $Al_xGa_yIn_zN$ (where $0 \leq x, y, z \leq 1$ and $x+y+z=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane".

In fabricating a semiconductor device using GaN-based semiconductors, a c-plane substrate, i.e., a substrate of which the principal surface is a (0001) plane, is used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer due to the quantum confinement Stark effect of carriers. Consequently, the internal quantum yield decreases. Thus, in the case of a semiconductor laser diode, the threshold current increases. In the case of an LED, the power dissipation increases, and the luminous efficacy decreases. Meanwhile, as the density of injected carriers increases, the piezoelectric field is screened, thus varying the emission wavelength, too.

Thus, to overcome these problems, it has been proposed that a substrate of which the principal surface is a non-polar plane such as a (10-10) plane that is perpendicular to the [10-10] direction and that is called an "m-plane" be used. As used herein, "-" attached on the left-hand side of a Miller-Bravais index in the parentheses means a "bar" (a negative direction index). As shown in FIG. 2, the m-plane is parallel to the c-axis (i.e., the primitive vector c) and intersects with the c-plane at right angles. On the m-plane, Ga atoms and nitrogen atoms are on the same atomic-plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above.

The "m-plane" is a generic term that collectively refers to a family of planes including (10-10), (-1010), (1-100), (-1100), (01-10) and (0-110) planes. As used herein, the "X-plane growth" means epitaxial growth that is produced perpendicularly to the X plane (where X=c or m) of a hexagonal wurtzite structure. As for the X-plane growth, the X plane will be sometimes referred to herein as a "growing plane". A layer of semiconductor crystals that have been formed as a result of the X-plane growth will be sometimes referred to herein as an "X-plane semiconductor layer".

CITATION LIST

Patent Literature

Patent Document 1: Japanese Laid-Open Patent Publication No. 2001-308462
Patent Document 2: Japanese Laid-Open Patent Publication No. 2003-332697

SUMMARY OF INVENTION

Technical Problem

As described above, a GaN-based semiconductor device whose growing plane is an m-plane would achieve far more beneficial effects than a GaN-based semiconductor device whose growing plane is a c-plane but still has the following drawback. Specifically, a GaN-based semiconductor device whose growing plane is an m-plane has higher contact resistance than a GaN-based semiconductor device whose growing plane is a c-plane, which constitutes a serious technical obstacle to using such a GaN-based semiconductor device whose growing plane is an m-plane.

Under the circumstances such as these, the present inventors carried out extensive research to overcome such a problem with the prior art that a GaN-based semiconductor device whose growing plane is an m-plane as a non-polar plane would have high contact resistance. As a result, we found an effective means for reducing the contact resistance.

One of the major objects of the present disclosure is to provide a structure which is capable of reducing the contact resistance in a GaN-based semiconductor device fabricated by means of m-plain crystal growth and a fabrication method of the semiconductor device.

Solution to Problem

A nitride-based semiconductor device according to an embodiment of the present invention includes: a nitride-based semiconductor multilayer structure including a p-type semiconductor region, a growing plane of the p-type semiconductor region being an rn-plane; and an electrode that is provided on the p-type semiconductor region, wherein the p-type semiconductor region includes a contact layer which is made of an $Al_xGa_yIn_zN$ ($x+y+z=1$, $x \geq 0$, $y > 0$, $z \geq 0$) semiconductor, the contact layer having a thickness of not less than 26 nm and not more than 60 nm, and the contact layer includes a body region which contains Mg of not less than $4\times10^{19}$ cm$^{-3}$ and not more than $2\times10^{20}$ cm$^{-3}$ and a high-concentration region which is in contact with the electrode and which has a Mg concentration of not less than $1\times10^{21}$ cm$^{-3}$.

In one embodiment, a thickness of the high-concentration region is not less than 0.5 nm and not more than 10 nm.

In one embodiment, the contact layer includes a transition region between the body region and the high-concentration region, the transition region containing Mg at a concentration which is higher than $2\times10^{20}$ cm$^{-3}$ and lower than $1\times10^{21}$ cm$^{-3}$.

In one embodiment, the body region contains Mg of not less than $4\times10^{19}$ cm$^{-3}$ and not more than $1\times10^{20}$ cm$^{-3}$.

In one embodiment, part of the electrode which is in contact with the high-concentration region is a first layer which contains at least any one of Mg, Zn, and Ag.

In one embodiment, the electrode includes a second layer provided on the first layer.

In one embodiment, the second layer is made of at least one metal selected from a group consisting of Ag, Pt, Mo, and Pd.

In one embodiment, the electrode is an Ag layer.

In one embodiment, the first layer is in the form of islands.

In one embodiment, the p-type semiconductor region further includes a p-type semiconductor layer which is made of an $Al_xGa_yIn_zN$ (x+y+z=1, x≥0, y≥0, z≥0) semiconductor that contains Mg of not less than $1\times10^{18}$ cm$^{-3}$ and not more than $1\times10^{19}$ cm$^{-3}$.

In one embodiment, a thickness of the p-type semiconductor region is not less than 100 nm and not more than 500 nm.

A light source according to an embodiment of the present invention includes: a nitride-based semiconductor light-emitting device; and a wavelength conversion section including a phosphoric material that converts a wavelength of light emitted from the nitride-based semiconductor light-emitting device, wherein the nitride-based semiconductor light-emitting device includes a nitride-based semiconductor multilayer structure including a p-type semiconductor region, a growing plane of the p-type semiconductor region being an in-plane, and an electrode that is provided on the p-type semiconductor region, the p-type semiconductor region includes a contact layer which is made of an $Al_xGa_yIn_zN$ (x+y+z=1, x≥0, y>0, z≥0) semiconductor, the contact layer having a thickness of not less than 26 nm and not more than 60 nm, and the contact layer includes a body region which contains Mg of not less than $4\times10^{19}$ cm$^{-3}$ and not more than $2\times10^{20}$ cm$^{-3}$ and a high-concentration region which is in contact with the electrode and which has a Mg concentration of not less than $1\times10^{21}$ cm$^{-3}$.

In one embodiment, a thickness of the high-concentration region is not less than 0.5 nm and not more than 10 nm.

In one embodiment, the contact layer includes a transition region between the body region and the high-concentration region, the transition region containing Mg at a concentration which is higher than $2\times10^{20}$ cm$^{-3}$ and lower than $1\times10^{21}$ cm$^{-3}$.

In one embodiment, the body region contains Mg of not less than $4\times10^{19}$ cm$^{-3}$ and not more than $1\times10^{20}$ cm$^{-3}$.

A nitride-based semiconductor light-emitting device fabrication method according to an embodiment of the present invention includes the steps of: (a) providing a substrate; (b) forming on the substrate a nitride-based semiconductor multilayer structure including a p-type semiconductor region, a growing plane of the p-type semiconductor region being an m-plane; and (c) forming an electrode on the growing plane of the p-type semiconductor region of the semiconductor multilayer structure, wherein step (b) includes a step (b1) of forming a contact layer as part of the p-type semiconductor region, the contact layer being made of an $Al_xGa_yIn_zN$ (x+y+z=1, x≥0, y>0, z≥0) semiconductor, the contact layer having a thickness of not less than 26 nm and not more than 60 nm, and step (b1) includes forming a body region which contains Mg of not less than $4\times10^{19}$ cm$^{-3}$ and not more than $2\times10^{20}$ cm$^{-3}$, and forming a high-concentration region which has a Mg concentration of not less than $1\times10^{21}$ cm$^{-3}$, and step (c) includes forming the electrode so as to be in contact with the high-concentration region.

In one embodiment, the body region contains Mg of not less than $4\times10^{19}$ cm$^{-3}$ and not more than $1\times10^{20}$ cm$^{-3}$.

In one embodiment, step (c) includes forming the electrode on the high-concentration region, the electrode having a first layer which contains at least any one of Mg, Zn, and Ag.

In one embodiment, step (c) includes forming the electrode such that the electrode has the first layer and a second layer provided on the first layer, the second layer being made of at least one metal selected from a group consisting of Ag, Pt, Mo, and Pd.

In one embodiment, the method further includes the step of performing a heat treatment after step (c).

A nitride-based semiconductor device of another embodiment of the present invention includes a nitride-based semiconductor multilayer structure including a p-type semiconductor region, a surface of the p-type semiconductor region being an m-plane; and an electrode that is provided on the p-type semiconductor region, wherein the p-type semiconductor region includes a contact layer which is made of an $Al_xGa_yIn_zN$ (x+y+z=1, x≥0, y≥0, z≥0) semiconductor, the contact layer containing Mg of not less than $4\times10^{19}$ cm$^{-3}$ and not more than $2\times10^{20}$ cm$^{-3}$, the contact layer having a thickness of not less than 26 nm and not more than 60 nm.

In one embodiment, the contact layer may be made of an $Al_xGa_yIn_zN$ (x+y+z=1, x≥0, y≥0, z≥0) semiconductor which contains Mg of not less than $4\times10^{19}$ cm$^{-3}$ and not more than $1\times10^{20}$ cm$^{-3}$ and which has a thickness of not less than 30 nm and not more than 45 nm.

In one embodiment, part of the electrode which is in contact with the contact layer may be a first layer which contains at least any one of Mg, Zn, and Ag.

In one embodiment, the electrode may include a second layer provided on the first layer.

In one embodiment, the second layer may be made of at least one metal selected from a group consisting of Ag, Pt, Mo, and Pd.

In one embodiment, the electrode may be an Ag layer.

In one embodiment, the first layer may be in the form of islands.

In one embodiment, the p-type semiconductor region may further include a p-type semiconductor layer which is made of an $Al_xGa_yIn_zN$ (x+y+z=1, x≥0, y≥0, z≥0) semiconductor that contains Mg of not less than $1\times10^{18}$ cm$^{-3}$ and not more than $1\times10^{19}$ cm$^{-3}$.

In one embodiment, a thickness of the p-type semiconductor layer is not less than 100 nm and not more than 500 nm.

A light source of another embodiment of the present invention includes a nitride-based semiconductor light-emitting device; and a wavelength conversion section including a phosphoric material that converts a wavelength of light emitted from the nitride-based semiconductor light-emitting device, wherein the nitride-based semiconductor light-emitting device includes a nitride-based semiconductor multilayer structure including a p-type semiconductor region, a surface of the p-type semiconductor region being an m-plane, and an electrode that is provided on the p-type semiconductor region, and the p-type semiconductor region includes a contact layer which is made of an $Al_xGa_yIn_zN$ (x+y+z=1, x≥0, y≥0, z≥0) semiconductor, the contact layer containing Mg of not less than $4×10^{19}$ cm$^{-3}$ and not more than $2×10^{20}$ cm$^{-3}$, the contact layer having a thickness of not less than 26 nm and not more than 60 nm.

In one embodiment, the contact layer may be made of an $Al_xGa_yIn_zN$ (x+y+z=1, x≥0, y≥0, z≥0) semiconductor which contains Mg of not less than $4×10^{19}$ cm$^{-3}$ and not more than $1×10^{20}$ cm$^{-3}$ and which has a thickness of not less than 30 nm and not more than 45 nm.

A nitride-based semiconductor light-emitting device fabrication method according to another embodiment of the present invention includes the steps of: (a) providing a substrate; (b) forming on the substrate a nitride-based semiconductor multilayer structure including a p-type semiconductor region which is made of an $Al_xGa_yIn_zN$ (x+y+z=1, x≥0, y≥0, z≥0) semiconductor, a surface of the p-type semiconductor region being an m-plane; and (c) forming an electrode on the surface of the p-type semiconductor region of the semiconductor multilayer structure, wherein step (b) includes forming the p-type semiconductor region that includes a contact layer which contains Mg of not less than $4×10^{19}$ cm$^{-3}$ and not more than $2×10^{20}$ cm$^{-3}$, the contact layer having a thickness of not less than 26 nm and not more than 60 nm.

In one embodiment, the contact layer may be made of an $Al_xGa_yIn_zN$ (x+y+z=1, x≥0, y≥0, z≥0) semiconductor which contains Mg of not less than $4×10^{19}$ cm$^{-3}$ and not more than $1×10^{20}$ cm$^{-3}$ and which has a thickness of not less than 30 nm and not more than 45 nm.

In one embodiment, step (c) may include forming the electrode on the surface of the p-type semiconductor region, the electrode having a first layer which contains at least any one of Mg, Zn, and Ag.

In one embodiment, step (c) may include forming the electrode such that the electrode has the first layer and a second layer provided on the first layer, the second layer being made of at least one metal selected from a group consisting of Ag, Pt, Mo, and Pd.

In one embodiment, the method may further include the step of performing a heat treatment after step (c).

Advantageous Effects of Invention

According to a nitride-based semiconductor device of the present disclosure, increase of the bulk resistance can be prevented, and the contact resistance can be reduced.

DESCRIPTION OF EMBODIMENTS

First Embodiment

Figure 1:
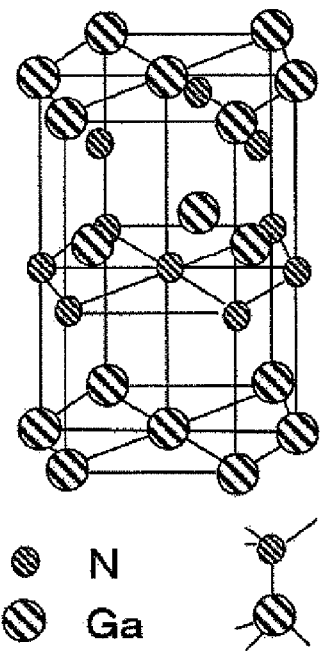
FIG. 1 is a perspective view schematically illustrating a unit cell of GaN.
Figure 2:
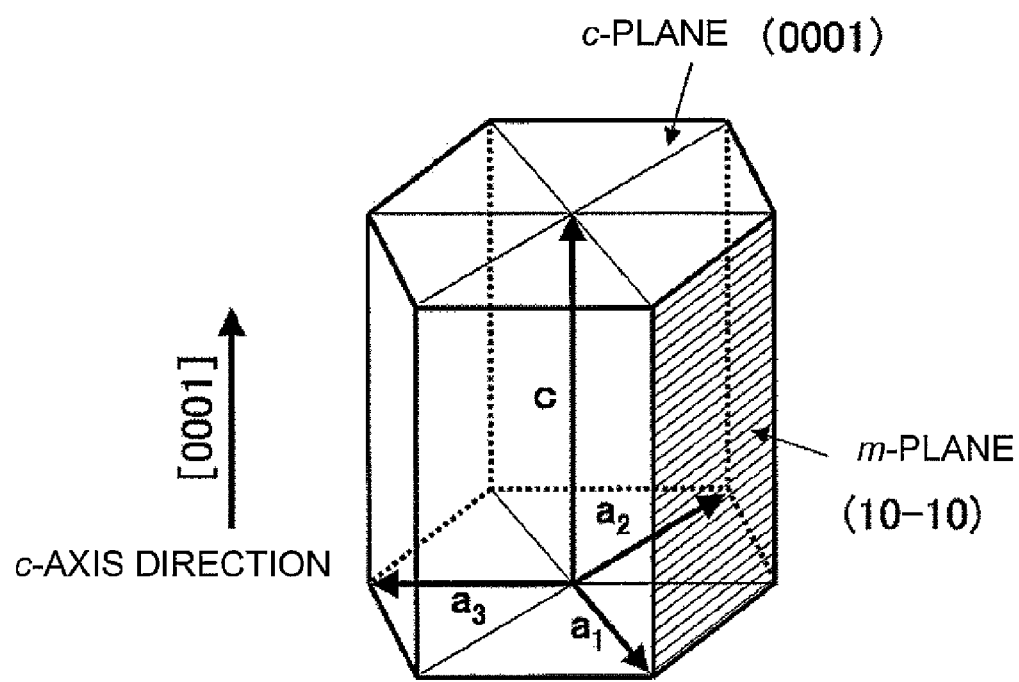
FIG. 2 is a perspective view showing primitive vectors $a_1$, $a_2$, $a_3$ and c representing a wurtzite crystal structure.

Hereinafter, a nitride-based semiconductor light-emitting device that is the first embodiment of the present invention will be described with reference to the accompanying drawings. In the drawings, any elements shown in multiple drawings and having substantially the same function will be identified by the same reference numeral for the sake of simplicity. It should be noted, however, that the present invention is in no way limited to the specific embodiments to be described below.

Figure 3:
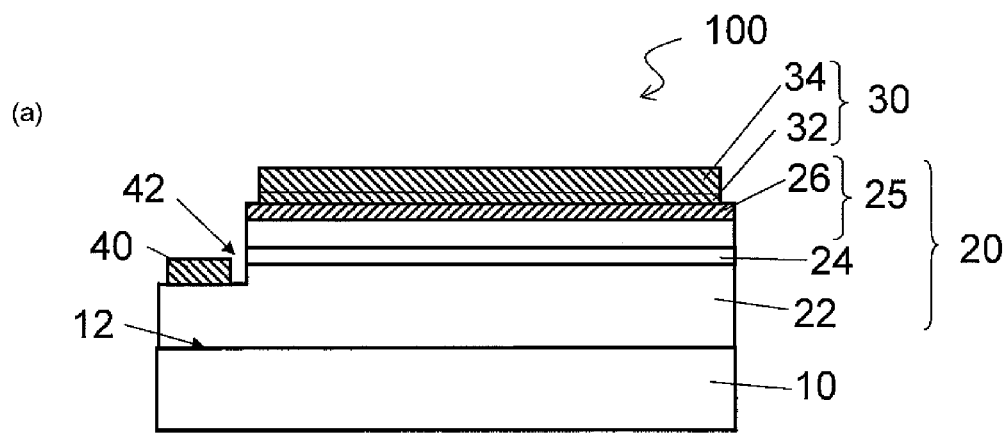
FIG. 3(a) is a schematic cross-sectional view illustrating a nitride-based semiconductor light-emitting device 100 as the first embodiment.
FIGS. 3(b) and 3(c) illustrate the crystal structures of an m-plane and a c-plane, respectively.
Figure 3:
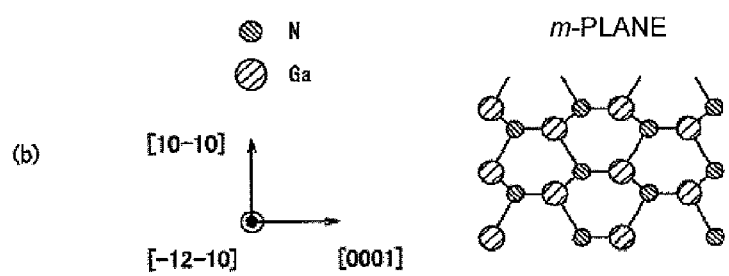
Figure 3:
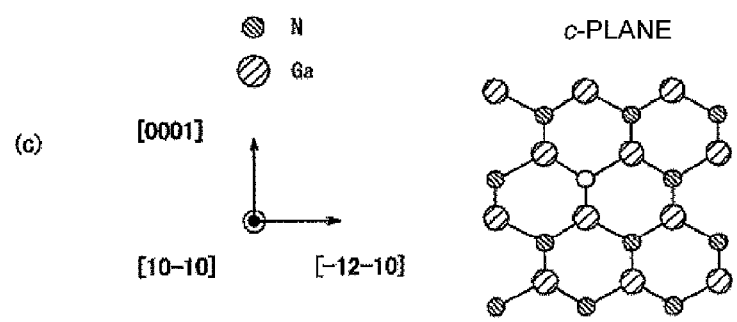

FIG. 3(a) schematically illustrates the cross-sectional structure of a nitride-based semiconductor light-emitting device 100 as the first embodiment of the present invention. What is illustrated in FIG. 3(a) is a semiconductor device made of GaN semiconductors and has a nitride-based semiconductor multilayer structure.

The nitride-based semiconductor light-emitting device 100 of this embodiment includes a GaN-based substrate 10, of which the principal surface (growing plane) 12 is an m-plane, a semiconductor multilayer structure 20 that has been formed on the GaN-based substrate (GaN substrate) 10, and an electrode 30 provided on the semiconductor multilayer structure 20. In this embodiment, the semiconductor multilayer structure 20 is an m-plane semiconductor multilayer structure that has been formed through an m-plane crystal growth and its principal surface (growing plane) is an m-plane. It should be noted, however, that a-plane GaN could grow on an r-plane sapphire substrate in some instances. That is why according to the growth conditions, the principal surface of the GaN-based substrate 10 does not always have to be an m-plane. In the semiconductor multilayer structure 20 of the present disclosure, at least the surface of its p-type semiconductor region that is in contact with an electrode needs to be an m-plane.

The nitride-based semiconductor light-emitting device 100 of this embodiment includes the GaN-based substrate 10 to support the semiconductor multilayer structure 20. However, the device 100 may have any other substrate instead of the GaN-based substrate 10 and could also be used without the substrate.

FIG. 3(b) schematically illustrates the crystal structure of a nitride-based semiconductor, of which the principal surface (growing plane) is an m-plane, as viewed on a cross section thereof that intersects with the principal surface of the substrate at right angles. Since Ga atoms and nitrogen atoms are present on the same atomic-plane that is parallel to the m-plane, no electrical polarization will be produced perpendicularly to the m-plane. That is to say, the m-plane is a non-polar plane and no piezoelectric field will be produced in an active layer that grows perpendicularly to the m-plane. It should be noted that In and Al atoms that have been added will be located at Ga sites and will replace the Ga atoms. Even if at least some of the Ga atoms are replaced with those In or Al atoms, no electrical polarization will still be produced perpendicularly to the m-plane.

Such a GaN-based substrate, of which the principal surface (growing plane) is an m-plane, will be referred to herein as an "m-plane GaN-based substrate". To obtain an m-plane nitride-based semiconductor multilayer structure that has grown perpendicularly to the m-plane, typically such an m-plane GaN-based substrate may be used and semiconductors may be grown on the m-plane of that substrate. This is because the crystallographic-plane orientation of the semiconductor multilayer structure should be identical with that of the principal surface (growing plane) of the GaN-based substrate. However, the principal surface of the substrate does not always have to be an m-plane as described above, and the device as a final product could already have its substrate removed.

The crystal structure of a nitride-based semiconductor, of which the principal surface is a c-plane, as viewed on a cross section thereof that intersects with the principal surface of the substrate at right angles is illustrated schematically in FIG. 3(c) just for a reference. In this case, Ga atoms and nitrogen atoms are not present on the same atomic-plane, and therefore, electrical polarization will be produced perpendicularly to the c-plane. Such a GaN-based substrate, of which the principal surface is a c-plane, will be referred to herein as a "c-plane GaN-based substrate".

A c-plane GaN-based substrate is generally used to grow GaN-based semiconductor crystals thereon. In such a substrate, a Ga atom layer and a nitrogen atom layer that extend parallel to the c-plane are slightly misaligned from each other in the c-axis direction, and therefore, electrical polarization will be produced in the c-axis direction.

Referring to FIG. 3(a) again, on the principal surface (that is an m-plane) 12 of the m-plane GaN-based substrate 10, the semiconductor multilayer structure 20 is formed. The semiconductor multilayer structure 20 includes an active layer 24 including an $Al_aIn_bGa_cN$ layer (where a+b+c=1, a≥0, b≥0 and c≥0), and an $Al_dGa_eN$ layer (where d+e=1, d≥0 and e≥0) 25, which is located on the other side of the active layer 24 opposite to the m-plane 12. In this embodiment, the active layer 24 is an electron injection region of the nitride-based semiconductor light-emitting device 100.

In this embodiment, the active layer 24 has a GaInN/GaN multi-quantum well (MQW) structure (with a thickness of 81 nm, for example) in which $Ga_{0.9}In_{0.1}N$ well layers (each having a thickness of 9 nm, for example) and GaN barrier layers (each having a thickness of 9 nm, for example) are alternately stacked one upon the other.

On the active layer 24, stacked is the p-type $Al_dGa_eN$ layer 25, which may have a thickness of 0.2 μm to 2 μm. Optionally, an undoped GaN layer could be inserted between the active layer 24 and the $Al_dGa_eN$ layer 25.

The semiconductor multilayer structure 20 of this embodiment has other layers, one of which is an $Al_uGa_vIn_wN$ layer (where u+v+w=1, u≥0, v≥0 and w≥0) 22 that is arranged between the active layer 24 and the GaN-based substrate 10. The $Al_uGa_vIn_wN$ layer 22 of this embodiment has first conductivity type, which may be n-type, for example.

In the $Al_dGa_eN$ layer 25, the mole fraction d of Al does not have to be uniform, but could vary either continuously or stepwise, in the thickness direction. In other words, the $Al_dGa_eN$ layer 25 could have a multilayer structure in which a number of layers with mutually different Al mole fractions d are stacked one upon the other, or could have its dopant concentration varied in the thickness direction.

In the vicinity of the uppermost surface of the $Al_dGa_eN$ layer 25, the p-$Al_dGa_eN$ contact layer 26 is provided. Part of the $Al_dGa_eN$ layer 25 excluding the p-$Al_dGa_eN$ contact layer 26 has a thickness of not less than 10 nm and not more than 500 nm, for example. In this part, the Mg concentration is, for example, not less than $1\times10^{18}$ cm$^{-3}$ and not more than $1\times10^{19}$ cm$^{-3}$. The p-$Al_dGa_eN$ contact layer 26 has a higher Mg concentration than the part of the $Al_dGa_eN$ layer 25 excluding the p-$Al_dGa_eN$ contact layer 26. High-concentration Mg in the p-$Al_dGa_eN$ contact layer 26 effectively enhances diffusion of Ga. When the part of the $Al_dGa_eN$ layer 25 excluding the p-$Al_dGa_eN$ contact layer 26 has a thickness of not less than 100 nm and not more than 500 nm, diffusion of Mg to the active layer 24 side can be prevented even though the p-$Al_dGa_eN$ contact layer 26 contains Mg with a high concentration. The Mg concentration in the p-$Al_dGa_eN$ contact layer 26 is, specifically, not less than $4\times10^{19}$ cm$^{-3}$ and not more than $2\times10^{20}$ cm$^{-3}$. More preferably, it is not more than $1\times10^{20}$ cm$^{-3}$. When the concentration of Mg in the p-$Al_dGa_eN$ contact layer 26 is lower than $4\times10^{19}$ cm$^{-3}$, the contact resistance cannot be sufficiently reduced. On the other hand, when the concentration of Mg in the p-$Al_dGa_eN$ contact layer 26 exceeds $1\times10^{20}$ cm$^{-3}$, the bulk resistance of the p-$Al_dGa_eN$ contact layer 26 starts to increase. When $2\times10^{20}$ cm$^{-3}$ is exceeded, the bulk resistance increases more conspicuously.

The thickness of the p-$Al_dGa_eN$ contact layer 26 is preferably not less than 26 nm and not more than 60 nm. More preferably, it is not less than 30 nm and not more than 45 nm. If the thickness of the p-$Al_dGa_eN$ contact layer 26 is less than 26 nm, the contact resistance cannot be sufficiently reduced. On the other hand, when the thickness of the p-$Al_dGa_eN$ contact layer 26 exceeds 45 nm, the bulk resistance of the p-$Al_dGa_eN$ contact layer 26 starts to increase. When 60 nm is exceeded, the bulk resistance increases more conspicuously. An essential condition for sufficient reduction of the contact resistance is that both the Mg concentration in the p-$Al_dGa_eN$ contact layer 26 and the thickness of the p-$Al_dGa_eN$ contact layer 26 are within the aforementioned ranges. For example, if the thickness of the p-$Al_dGa_eN$ contact layer 26 is 10 nm, the contact resistance does not sufficiently decrease even when the Mg concentration is not less than $4\times10^{19}$ cm$^{-3}$ and not more than $2\times10^{20}$ cm$^{-3}$. The impurity concentration and the thickness of the p-$Al_dGa_eN$ contact layer 26 will be described later in detail with measurement results.

From the viewpoint of reducing the contact resistance, the p-Al$_d$Ga$_e$N contact layer 26 is preferably formed of a layer in which the Al mole fraction d is zero (i.e., a GaN layer). However, the Al mole fraction d does not need to be zero. For example, an Al$_{0.05}$Ga$_{0.95}$N layer, of which the Al mole fraction d is approximately 0.05, may also be used as the p-Al$_d$Ga$_e$N contact layer 26.

An electrode 30 has been formed on the semiconductor multilayer structure 20. The electrode 30 of this embodiment includes an Mg layer 32 and an Ag layer 34 formed on the Mg layer 32. In the electrode 30, the Mg layer 32 is in contact with the p-Al$_d$Ga$_e$N contact layer 26 of the semiconductor multilayer structure 20 and functions as a portion of a p-(or p-side) electrode.

In the electrode 30, the Mg layer 32 and the Ag layer 34 may be at least partially made of an alloy thereof. Specifically, only a boundary part of the Mg layer 32 and the Ag layer 34 may be made of an alloy. Alternatively, the entire electrode 30 may be made of an alloy.

Figure 4:
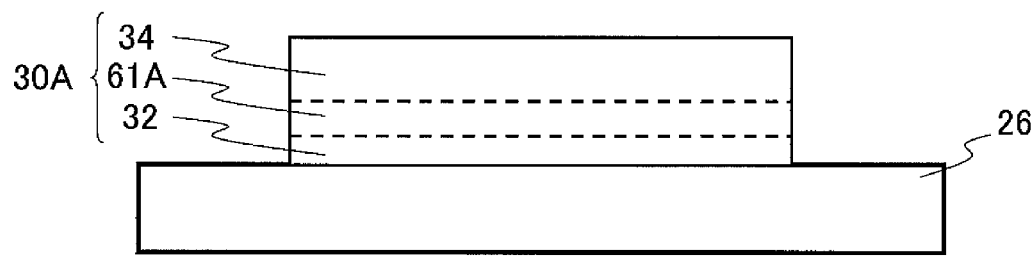
FIGS. 4(a) through 4(c) are diagrams schematically showing the distribution of Mg and Ag in an electrode.
Figure 4:
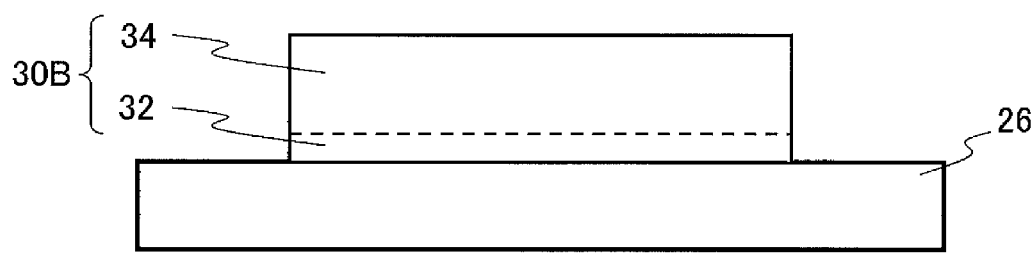
Figure 4:
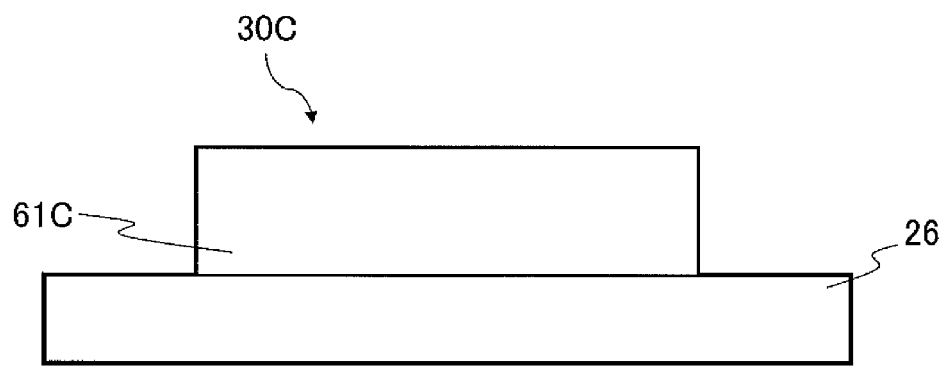

FIGS. 4(a) to 4(c) are diagrams for illustrating the process of alloying the Mg layer 32 and the Ag layer 34. FIG. 4(a) shows a state of the structure in which the Mg layer 32 and the Ag layer 34 have been partially alloyed. In this case, as shown in FIG. 4(a), the electrode 30A includes the Mg layer 32 that is in contact with the p-Al$_d$Ga$_e$N contact layer 26, an Mg—Ag alloy layer 61A lying over the Mg layer 32, and the Ag layer 34 lying over the Mg—Ag alloy layer 61A.

FIG. 4(b) shows a state of the structure in which alloying of Mg and Ag has advanced such that the alloyed portion is in contact with the p-Al$_d$Ga$_e$N contact layer 26. In the state shown in FIG. 4(b), the Mg layer 32 of the electrode 30B (a portion of the electrode 30B which is in contact with the p-Al$_d$Ga$_e$N contact layer 26) is made of an Mg—Ag alloy. In the example of the electrode 30B shown in FIG. 4(b), the Ag layer 34 is lying over the Mg layer 32.

FIG. 4(c) shows a state of the electrode 30C in which the Mg layer and the Ag layer have been entirely alloyed. In this state, the electrode 30C is formed only of an Mg—Ag alloy layer 61C.

The Mg—Ag alloys shown in FIGS. 4(a) to 4(c) are made of Mg and Ag (i.e., the major constituents are Mg and Ag). The structures shown in FIGS. 4(a) to 4(c) can be formed by forming an Ag layer on an Mg layer and thereafter performing a heat treatment on these layers. Note that the structure shown in FIG. 4(c) may be formed by performing a vapor deposition using a mixture or compound of Mg and Ag as a source material and thereafter performing a heat treatment on the deposited material.

The Ag layer 34 may be an alloy layer made of Ag as a major constituent and one or more metal additives different from Ag (for example, Cu, Au, Pd, Nd, Sm, Sn, In, Bi) of a very small amount. The Ag layer 34 formed by alloying such metals is superior to Ag in terms of, for example, heat resistance and reliability.

On each of the above-described electrodes 30A, 30B, and 30C, an electrode layer or an interconnect layer made of a different metal or metal alloy may be provided in addition to the Mg layer 32 and the Ag layer 34.

Note that at least part of the Mg layer 32 may undergo aggregation to form islands over the surface of the p-Al$_d$Ga$_e$N contact layer 26 due to the heat treatment performed after the formation of the layer, so that the islands are separated from one another with spaces. In this case, Ag atoms that constitute the Ag layer 34 intervene between the respective island-like Mg layers 32. At least part of the Ag layer 34 may undergo aggregation to form islands.

In this embodiment, the thickness of the electrode 30 may be, for example, not less than 10 nm and not more than 200 nm. In the electrode 30, the thickness of the Mg layer 32 may be, for example, not less than 2 nm and not more than 45 nm. It should be noted that in this case, the thickness of the Mg layer 32 is supposed to be that of the Mg layer that has already been thermally treated.

The thickness of the Ag layer 34 is, for example, not more than 200 nm (or not less than 10 nm and not more than 200 nm). Note that the thickness of the Mg layer 32 is preferably smaller than the thickness of the Ag layer 34. This is for the purpose of preventing separation of the Mg layer 32 and the p-Al$_d$Ga$_e$N contact layer 26 which may be caused due to disturbed balance of strain between the Mg layer 32 and the Ag layer 34.

In the first embodiment, the electrode 30 is formed of the Mg layer 32 (first layer) that is in contact with the p-Al$_d$Ga$_e$N contact layer 26 and the Ag layer 34 (second layer) that is provided on the Mg layer 32. The first layer may be made of Zn. Alternatively, the first layer may be made of an alloy of Mg and Zn. Still alternatively, the first layer may be made of an alloy of Mg or Zn and a metal which is different from Mg or Zn.

The second layer may be made of a metal which is different from Ag (e.g., Pt, Pd, or Mo). The electrode 30 does not necessarily have a multilayer structure which is formed of the first layer and the second layer. The electrode 30 may have a structure which is formed of a single layer only.

Meanwhile, the GaN-based substrate 10, of which the principal surface 12 is an m-plane, may have a thickness of 100 µm to 400 µm, for example. This is because if the wafer has a thickness of at least approximately 100 µm, then there will be no trouble handling such a wafer. It should be noted that as long as the GaN-based substrate 10 of this embodiment has an m-plane principal surface 12 made of a GaN-based material, the GaN-based substrate 10 could have a multilayer structure. That is to say, the GaN-based substrate 10 of this embodiment could also refer to a substrate, at least the principal surface 12 of which is an m-plane. That is why the entire substrate could be made of a GaN-based material. Or the substrate may also be made of the GaN-based material and another material in any combination.

In the structure of this embodiment, above the GaN-based substrate 10, an electrode 40 has been formed as an n-side electrode on a portion of an n-type Al$_u$Ga$_v$In$_w$N layer 22 (with a thickness of 0.2 µm to 2 µm, for example). In the example illustrated in FIG. 3(a), in the region of the semiconductor multilayer structure 20 where the electrode 40 is arranged, a recess 42 has been cut so as to expose a portion of the n-type Al$_u$Ga$_v$In$_w$N layer 22. And the electrode has been formed on the exposed surface of the n-type Al$_u$Ga$_v$In$_w$N layer 22 at the bottom of the recess 42. The electrode 40 may have a multilayer structure consisting of Ti, Al and Ag layers and may have a thickness of 100 nm to 200 nm, for example.

Figure 5:
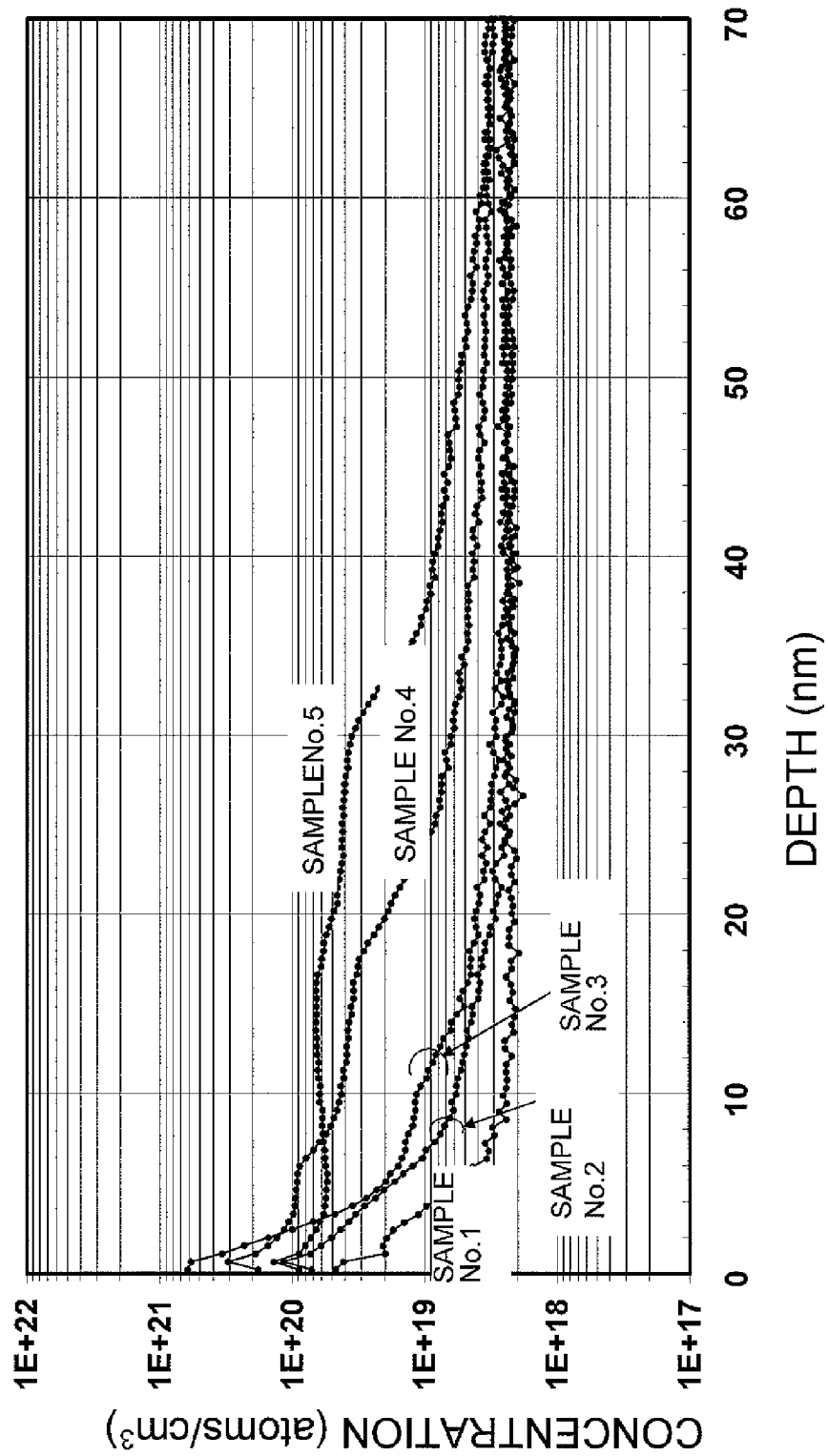
FIG. 5 is a graph showing the results of measurement of the profile of Mg along the depth direction in the p-$Al_dGa_eN$ contact layer 26 of Samples No. 1 through No. 5 (before formation of the electrode) with the use of a SIMS (Secondary Ion-microprobe Mass Spectrometer).

FIG. 5 shows the results of measurement of the profile of Mg atom along the depth direction in the Al$_d$Ga$_e$N layer 25 that includes the p-Al$_d$Ga$_e$N contact layer 26 with the use of a SIMS. The origin of the horizontal axis (0 µm) generally corresponds to the surface of the p-Al$_d$Ga$_e$N contact layer 26. The range of positive (+) horizontal-axis values corresponds to a region which is closer to the substrate than the surface of the p-Al$_d$Ga$_e$N contact layer 26 is. A greater horizontal-axis value corresponds to a deeper position. Note that "1.0E+17" on the vertical axis means "$1.0 \times 10^{17}$", and "1.0E+18" means "$1.0 \times 10^{18}$". That is to say, "1.0E+X" means "$1.0 \times 10^X$".

The measurement results shown in FIG. 5 were obtained under a condition that an electrode was not provided on the AlGaN layer 25. The reason why the measurement was carried out under such a condition is to eliminate the effects of formation of the electrode.

Sample No. 1 is a sample in which the $Al_dGa_eN$ layer 25 does not include the p-$Al_dGa_eN$ contact layer 26. Among Samples No. 2 through No. 5, in the step of forming the $Al_dGa_eN$ layer 25, the timing of starting formation of the p-$Al_dGa_eN$ contact layer 26 is different. In Sample No. 2, the thickness of a p-type contact layer (in which the Mg impurity concentration is not less than $4 \times 10^{19}$ cm$^{-3}$) is about 3 nm. In Sample No. 3, the thickness of a p-type contact layer (in which the Mg impurity concentration is not less than $4 \times 10^{19}$ cm$^{-3}$) is about 5 nm. In Sample No. 4, the thickness of a contact layer (in which the Mg impurity concentration is not less than $4 \times 10^{19}$ cm$^{-3}$) is about 15 nm. In Sample No. 5, the thickness of a contact layer (in which the Mg impurity concentration is not less than $4 \times 10^{19}$ cm$^{-3}$) is about 26 nm.

FIG. 6A through FIG. 6E show the results of measurement of the current-voltage characteristic and the specific contact resistance of Samples No. 1 through No. 5 shown in FIG. 5 with an electrode which includes Mg/Ag layers being formed thereon. The contact resistances shown in FIG. 6A through FIG. 6E were evaluated using a TLM (Transmission Line Method). Respective ones of the curves of the current-voltage characteristic shown in FIG. 6A through FIG. 6E correspond to the distances between electrodes of a TLM electrode pattern shown in FIG. 6F. FIG. 6F shows an arrangement of a plurality of electrodes of 100 µm×200 µm with the intervals of 8 µm, 12 µm, 16 µm, and 20 µm. In general, the contact resistance is inversely proportional to the area of the contact, S (cm$^2$). Here, the relationship of R=Rc/S holds true where R (Ω) is the contact resistance. The constant of proportionality, Rc, is called "specific contact resistance" and is equivalent to the contact resistance R on the assumption that the contact area S is 1 cm$^2$. That is, the largeness of the specific contact resistance does not depend on the contact area S and serves as an index for evaluation of the contact characteristic. Hereinafter, the "specific contact resistance" is sometimes abbreviated as "contact resistance".

Figure 6A:
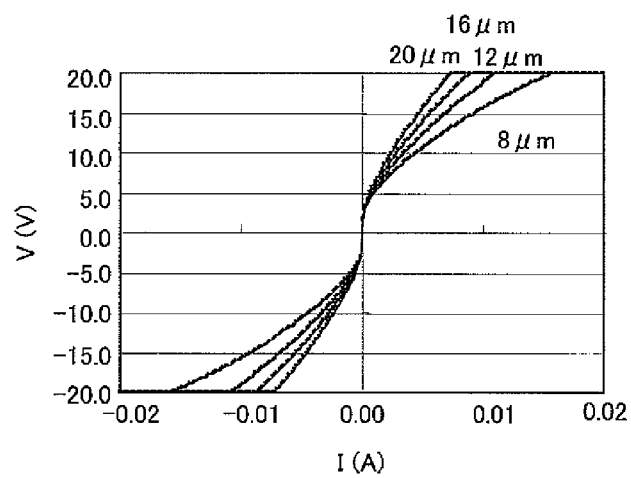
FIG. 6A is a graph showing the results of measurement of the current-voltage characteristic and the specific contact resistance of Sample No. 1 shown in FIG. 5.
Figure 6B:
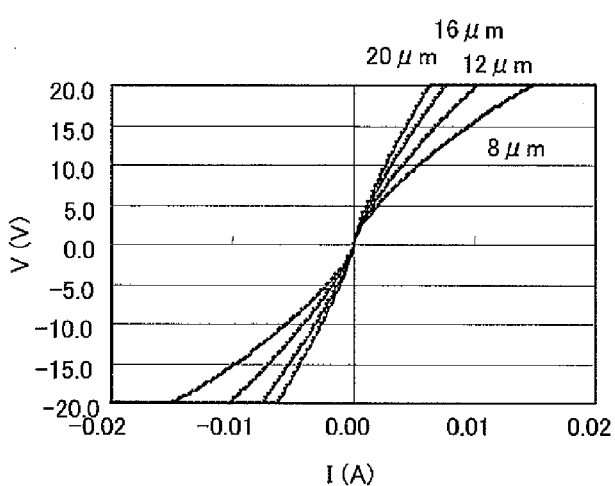
FIG. 6B is a graph showing the results of measurement of the current-voltage characteristic and the specific contact resistance of Sample No. 2 shown in FIG. 5.
Figure 6C:
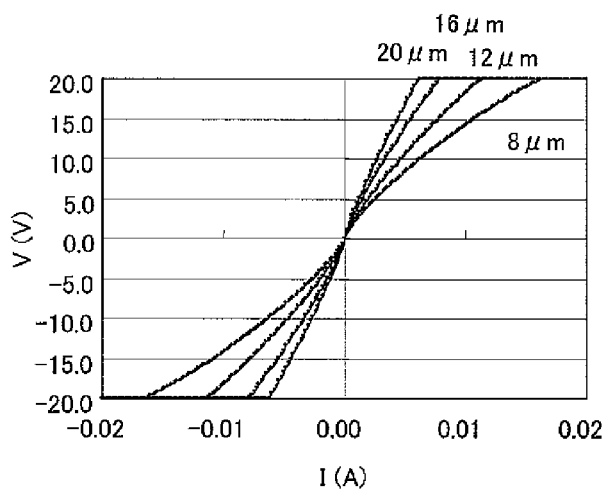
FIG. 6C is a graph showing the results of measurement of the current-voltage characteristic and the specific contact resistance of Sample No. 3 shown in FIG. 5.
Figure 6D:
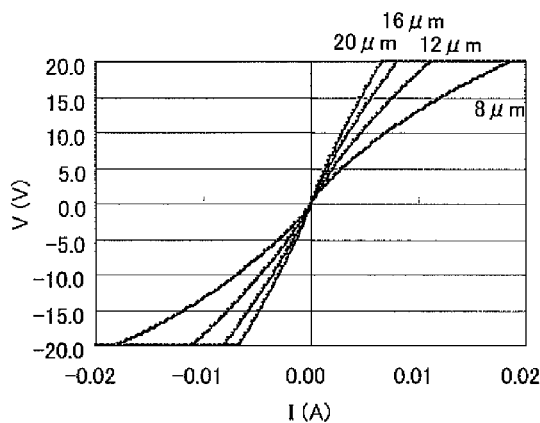
FIG. 6D is a graph showing the results of measurement of the current-voltage characteristic and the specific contact resistance of Sample No. 4 shown in FIG. 5.
Figure 6E:
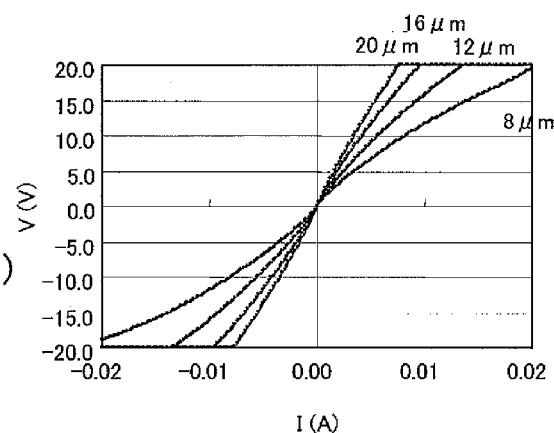
FIG. 6E is a graph showing the results of measurement of the current-voltage characteristic and the specific contact resistance of Sample No. 5 shown in FIG. 5.
Figure 6F:
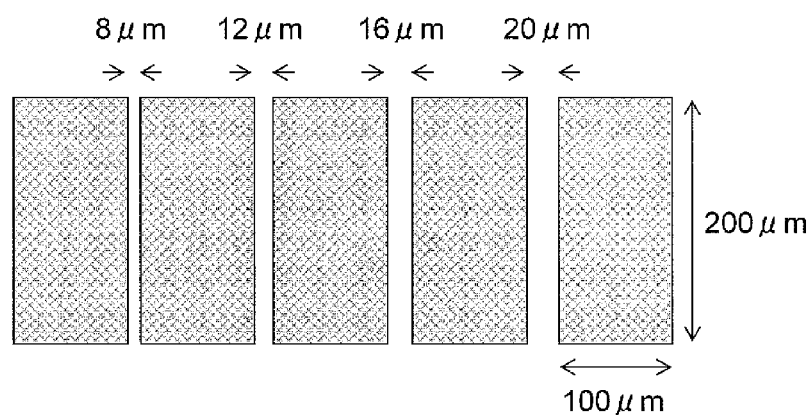
FIG. 6F is a pattern diagram of a TLM electrode.

The specific contact resistance of Sample No. 1 that does not have the p-$Al_dGa_eN$ contact layer 26 is $3.7 \times 10^{-2}$ (Ωcm$^2$) as seen from FIG. 6A. In Samples No. 2, No. 3, and No. 4, the thickness of the p-$Al_dGa_eN$ contact layer 26 is 3 nm, 5 nm, and 15 nm, respectively. The specific contact resistances of the respective samples are $7.1 \times 10^{-2}$ (Ωcm$^2$), $2.0 \times 10^{-3}$ (Ωcm$^2$), and $1.6 \times 10^{-3}$ (Ωcm$^2$) as seen from FIG. 6B through FIG. 6D. It is seen from these results that, as the thickness of the p-$Al_dGa_eN$ contact layer 26 increases, the value of the specific contact resistance decreases. In Sample No. 5, the thickness of the p-$Al_dGa_eN$ contact layer 26 is 26 nm. The specific contact resistance of Sample No. 5 is $1.1 \times 10^{-3}$ (Ωcm$^2$) as seen from FIG. 6E.

It is seen from the above result that, when the thickness of the p-$Al_dGa_eN$ contact layer 26 (a portion of the $Al_dGa_eN$ layer 25 which contains Mg impurity of not less than $4 \times 10^{19}$ cm$^{-3}$) is 26 nm, the specific contact resistance is $1.1 \times 10^{-3}$ Ωcm$^2$, and this value decreases as the thickness of the p-$Al_dGa_eN$ contact layer 26 increases.

The inventor of the present application has disclosed in the prior applications (e.g., PCT/JP2010/001920) that the specific contact resistance can be decreased by forming an electrode which includes an Mg layer on an m-plane p-type nitride semiconductor layer. As seen from the results shown in FIG. 6A through FIG. 6E, in a configuration where the Mg layer 32 is in contact with the p-$Al_dGa_eN$ contact layer 26, the contact resistance can be further decreased by optimizing the Mg concentration profile of the p-$Al_dGa_eN$ contact layer 26.

Figure 7:
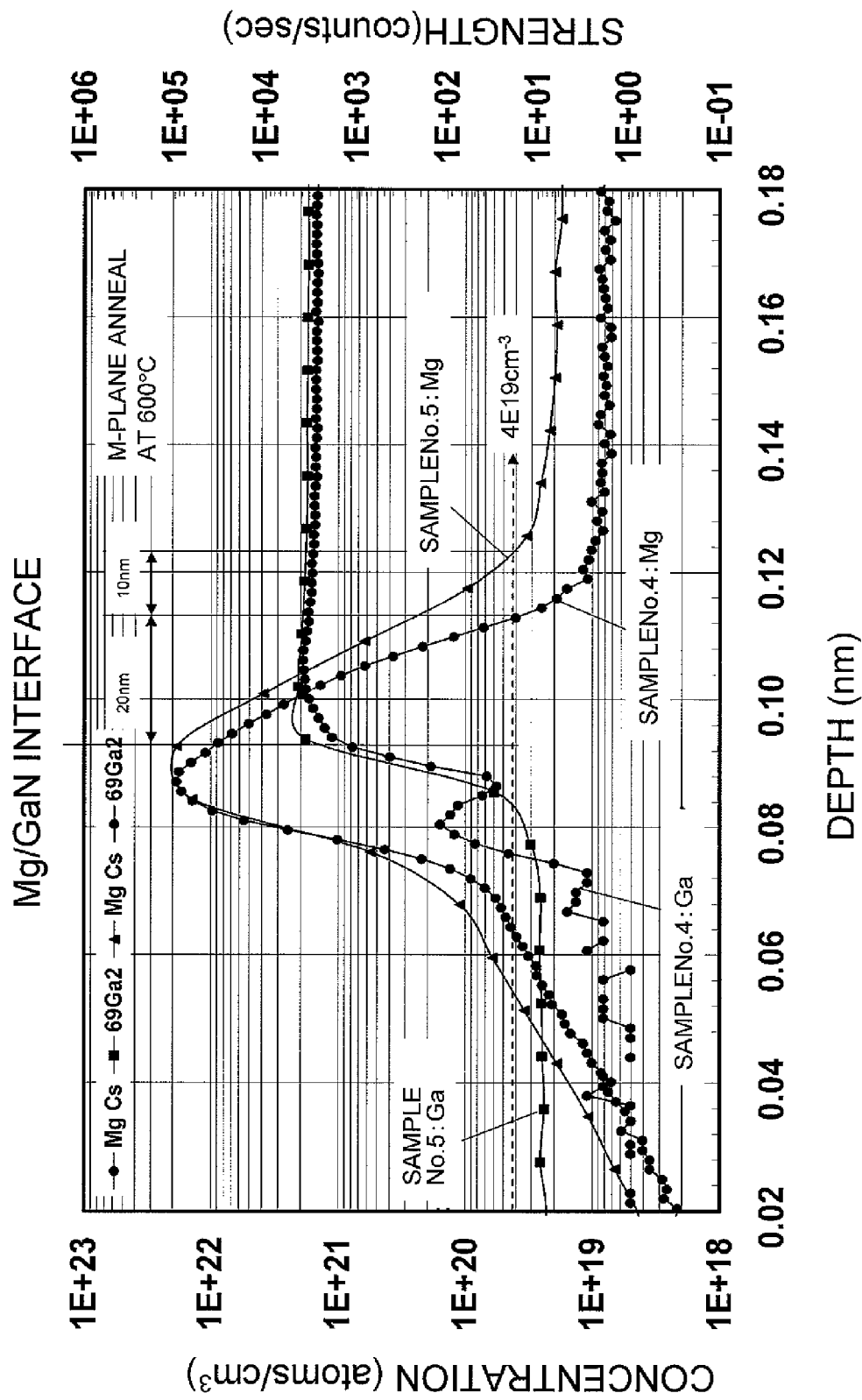
FIG. 7 is a graph showing the results of measurement of the profiles of Mg and Ga along the depth direction in Samples No. 1 through No. 5 (after formation of the electrode) with the use of a SIMS.

FIG. 7 shows the results of measurement, with the use of a SIMS, of the profiles of Mg atom and Ga atom along the depth direction in samples obtained by forming the electrode 30 that is constituted of Mg/Ag layers on Samples No. 4 and No. 5 shown in FIG. 5. Before the heat treatment, the thickness of the Mg layer of the electrode 30 is 7 nm, and the thickness of the Ag layer is 75 nm. Along the vertical axis of the graph, the signal strength detected by a detector of the SIMS and the atomic concentration that is proportional to this signal strength are shown. The profiles shown in FIG. 7 are the measurement results of the samples which underwent a heat treatment at 600° C. for 10 minutes with the electrode 30 having been formed.

As seen from FIG. 7, a value of the "Depth" on the horizontal axis which is near 0.09 indicates the interface between the Mg layer 32 of the electrode 30 and the p-$Al_dGa_eN$ contact layer 26. A position which has a greater horizontal-axis value than that of this interface is within the extent of the p-$Al_dGa_eN$ contact layer 26. A position which has a smaller horizontal-axis value than that of this interface is within the extent of the electrode 30.

As seen from FIG. 7, in either of Samples No. 4 and No. 5, the presence of Ga in the electrode 30 was observed. In Sample No. 4, the Ga concentration in the electrode 30 is not more than $1 \times 10^{19}$ cm$^{-3}$. On the other hand, in Sample No. 5, the Ga concentration in the electrode 30 is not less than $2 \times 10^{19}$ cm$^{-3}$. Thus, in Sample No. 4, the amount of Ga diffused into the electrode 30 is smaller than in Sample No. 5. From this result, the inventor of the present application found that, as the thickness of the p-$Al_dGa_eN$ contact layer 26 increases, the amount of diffused Ga increases. As seen from the results shown in FIG. 6D and FIG. 6E, Sample No. 4 exhibits a lower contact resistance than Sample No. 5. From these results, it was confirmed that there is a correlation between the amount of Ga diffused into the electrode 30 and the contact resistance, although the details of that cause were unknown.

In the p-type GaN, if Ga atoms are diffused toward the electrode side, the outermost surface of the p-type GaN is lacking Ga atoms, so that Ga vacancies are formed. The Ga vacancies have acceptor-like properties, and therefore, as the number of Ga vacancies increases in the vicinity of the interface between the electrode and the p-type GaN, holes more readily pass through the Schottky barrier of this interface by means of tunneling. In the present embodiment, the Mg layer 32 is formed on the p-$Al_dGa_eN$ contact layer 26, and the Mg concentration profile of the p-$Al_dGa_eN$ contact layer 26 is optimized. It is inferred that this enhances migration of Ga so that the contact resistance decreases. It is also inferred that the principle of formation of Ga vacancies due to Mg is the same as that described in the prior application (PCT/JP2009/002532).

On the other hand, if N atoms as well as Ga atoms are diffused toward the electrode side, the outermost surface of the p-type GaN is lacking N atoms, so that N vacancies are also formed. The N vacancies have donor-like properties, so that at the outermost surface of the p-type GaN, charge compensation occurs between the Ga vacancies and the N vacancies. Also, it is estimated that the absence of the N atoms would degrade the crystallinity of GaN crystals. Therefore, when N atoms as well as Ga atoms are diffused toward the electrode side, the contact resistance between the p-type GaN layer and the electrode is high. Note that the inventor of the present application confirmed by other experiments that, in the present embodiment, N atoms were scarcely diffused toward the electrode side. It is estimated that the behaviors of respective ones of such elements occur likewise even when some of Ga atoms are replaced by In atoms in the p-$Al_dGa_eN$ contact layer 26. It is estimated that the same holds true for a case where a Zn layer is used as the first layer of the electrode 30, a case where an alloy of Mg and Zn is used, a case where an alloy of Mg or Zn and a metal which is different from these elements is used, and a case where a metal which is different from Ag is used for the second layer.

Next, it will be described with reference to FIG. 3(a) once again how to fabricate the nitride-based semiconductor light-emitting device of this embodiment.

First of all, an m-plane GaN-based substrate 10 is prepared. In this embodiment, a GaN substrate is used as the GaN-based substrate 10. The GaN substrate of this embodiment is obtained by HVPE (hydride vapor phase epitaxy).

For example, a thick GaN film is grown to a thickness of several nanometers on a c-plane sapphire substrate, and then diced perpendicularly to the c-plane (i.e., parallel to the m-plane), thereby obtaining m-plane GaN substrates. However, the GaN substrate does not have to be prepared by this particular method. Alternatively, an ingot of bulk GaN may be made by a liquid phase growth process such as a sodium flux process or a melt-growth method such as an ammonothermal process and then diced parallel to the m-plane.

The GaN-based substrate 10 may be replaced by a gallium oxide substrate, an SiC substrate, an Si substrate or a sapphire substrate, for example. To grow an m-plane GaN-based semiconductor on the substrate by epitaxy, the principal surface of the SiC or sapphire substrate is preferably also an m-plane. However, in some instances, a-plane GaN could grow on an r-plane sapphire substrate. That is why according to the growth conditions, the surface on which the crystal growth should take place does not always have to be an m-plane. In any case, at least the surface of the semiconductor multilayer structure 20 should be an m-plane. In this embodiment, crystal layers are formed one after another on the GaN-based substrate 10 by MOCVD (metalorganic chemical vapor deposition) process.

Specifically, an $Al_uGa_vIn_wN$ layer 22 is formed on the m-plane GaN-based substrate 10. As the $Al_uGa_vIn_wN$ layer 22, AlGaN may be deposited to a thickness of 3 μm, for example. An AlGaN layer may be deposited by supplying TMG(Ga($CH_3$)$_3$), TMA(Al($CH_3$)$_3$) and $NH_3$ gases onto the m-plane GaN-based substrate 10 at 1,100° C., for example.

Subsequently, an active layer 24 is formed on the $Al_uGa_vIn_wN$ layer 22. In this example, the active layer 24 has a GaInN/GaN multi-quantum well (MQW) structure in which $Ga_{0.9}In_{0.1}N$ well layers and GaN barrier layers, each having a thickness of 9 nm, have been stacked alternately to have an overall thickness of 81 nm. When the $Ga_{0.9}In_{0.1}N$ well layers are formed, the growth temperature is preferably lowered to 800° C. to introduce In.

Thereafter, an undoped GaN layer is deposited to a thickness of 30 nm, for example, on the active layer 24, and then an $Al_dGa_eN$ layer 25 is formed on the undoped GaN layer. As the $Al_dGa_eN$ layer 25, p-$Al_{0.14}Ga_{0.86}N$ is deposited to a thickness of 0.5 μm, at the growth temperature of 950° C., by supplying TMG, $NH_3$, and TMA gases and $Cp_2Mg$ (cyclopentadienyl magnesium) gas as a p-type dopant.

Then, in the upper part of the $Al_dGa_eN$ layer 25, a p-$Al_dGa_eN$ contact layer 26 of 26 nm thick, for example, is deposited. Here, the supply of $Cp_2Mg$ is increased such that the Mg concentration of the p-$Al_dGa_eN$ contact layer 26 is higher than the Mg concentration of the remaining part of the $Al_dGa_eN$ layer 25.

As the p-$Al_dGa_eN$ contact layer 26, a 26 nm thick GaN layer with the Mg concentration of $4 \times 10^{19}$ $cm^{-3}$ may be formed. In this case, formation of the GaN layer may be realized by supplying, for example, TMG at a flow rate of 8 sccm, $NH_3$ at a flow rate of 7.5 slm, and $Cp_2Mg$ at a flow rate of 400 sccm, while the growth temperature is maintained at 950° C. For example, if the ratio of the flow rate of the source gas of Mg to the total flow rate of the source gases (source gases for crystal and impurity) is not less than 5%, the impurity concentration of the p-$Al_dGa_eN$ contact layer 26 can be not less than $4 \times 10^{19}$ $cm^{-3}$.

Preferably, the growth temperature of the p-$Al_dGa_eN$ contact layer 26 is not less than 900° C. and not more than 1000° C. If the growth temperature is lower than 900° C., there may be a problem that the crystallinity deteriorates due to the decrease of the growth rate. If the growth temperature is higher than 1000° C., absence of nitrogen may cause surface roughness.

Thereafter, respective portions of the p-GaN contact layer, the $Al_dGa_eN$ layer 25, the undoped GaN layer, and the active layer 24 are removed by performing a chlorine-based dry etching process, thereby making a recess 42 and exposing a region of the $Al_uGa_vIn_wN$ layer 22 where an n-electrode will be formed. Then, Ti/Pt layers are deposited as an n-electrode 40 on the region reserved for an n-type electrode at the bottom of the recess 42.

Subsequently, an Mg layer 32 is formed on the p-$Al_dGa_eN$ contact layer 26 and then an Ag layer 34 is stacked on the Mg layer 32, thereby forming a p-electrode 30.

The Mg layer 32 is preferably formed by a pulse evaporation process for the purpose of forming a dense film of high quality, but may alternatively be formed by a thermal CVD process, a molecular beam epitaxy (MBE), or the like. The Ag layer 34 may be formed by, for example, a commonly-employed evaporation method.

Thereafter, a heat treatment is carried out at 600° C. for 10 minutes.

When the temperature of the heat treatment, which was carried out with the electrode 30 having been formed, became equal to or higher than 500° C., the contact resistance sharply decreased. At 600° C., the contact resistance further decreased. When the temperature was further increased to 700° C., the contact resistance was higher than that obtained at 600° C., but was lower than the contact resistance of the prior art. The heat treatment temperature is preferably not less than 500° C., for example. When the heat treatment temperature exceeds 700° C. to reach a predetermined temperature (e.g., 800° C.) or higher, the film quality of the electrode and the GaN layer further degrades. Therefore, the upper limit of the heat treatment temperature is preferably not more than 700° C. (PCT/JP2010/001920).

Optionally, the GaN-based substrate 10 and a portion of the $Al_uGa_vIn_wN$ layer 22 could be removed by some technique such as laser lift-off, etching or polishing. In that case, either only the GaN-based substrate 10 or the GaN-based substrate 10 and a portion of the $Al_uGa_vIn_wN$ layer 22 could be removed selectively. It is naturally possible to leave the GaN-based substrate 10 and the $Al_uGa_vIn_wN$ layer 22 as they are without removing them. By performing these process steps, the nitride-based semiconductor light-emitting device 100 of this embodiment is completed.

In the nitride-based semiconductor light-emitting device 100 of this embodiment, when a voltage is applied to between the n- and p-electrodes 40 and 30, holes are injected from the p-electrode 30 into the active layer 24 and electrons are injected from the n-electrode 40 into the active layer 24, thus producing photoluminescence with a wavelength of about 450 nm.

When Mg of not less than $4 \times 10^{19}$ $cm^{-3}$ is contained in a p-type nitride-based compound semiconductor layer which has a c-plane principal surface, the contact resistance between the p-type nitride-based compound semiconductor layer and the electrode increases due to the increase in resistance in that layer. In the case of c-plane, the Mg's effect of enhancing diffusion of Ga is small. In the p-type nitride-based compound semiconductor layer which has a c-plane principal surface, from the viewpoint of reducing the resistance in the layer, it is probably preferred to decrease the thickness of the p-type nitride-based compound semiconductor layer as small as possible (e.g., about 10 nm). Also in the p-$Al_dGa_eN$ contact layer 26 of the present embodiment which has an m-plane principal surface, as the Mg impurity concentration increases, the resistance in the layer increases while, however, the contact resistance decreases.

In the case of a c-plane nitride-based semiconductor light-emitting device which was fabricated under the same conditions as those of the present embodiment except that c-plane growth was employed (comparative example), it was confirmed that the contact resistance between the p-type nitride-based semiconductor layer (c-plane) and the Mg/Ag electrode was about $8.0 \times 10^{-3}$ $\Omega cm^2$. This value is a high value as compared with the contact resistance obtained in the case of m-plane growth. This is probably because, in the case of the c-plane nitride-based semiconductor light-emitting device, N atoms as well as Ga atoms were diffused toward the Mg/Ag electrode side.

Second Embodiment

Hereinafter, a nitride-based semiconductor light-emitting device of the second embodiment of the present invention is described with reference to the drawings. In the drawings mentioned below, for brevity of description, elements which have substantially the same function will be identified by the same reference numeral. Note that the present invention is not limited to the embodiment described below.

Figure 8:
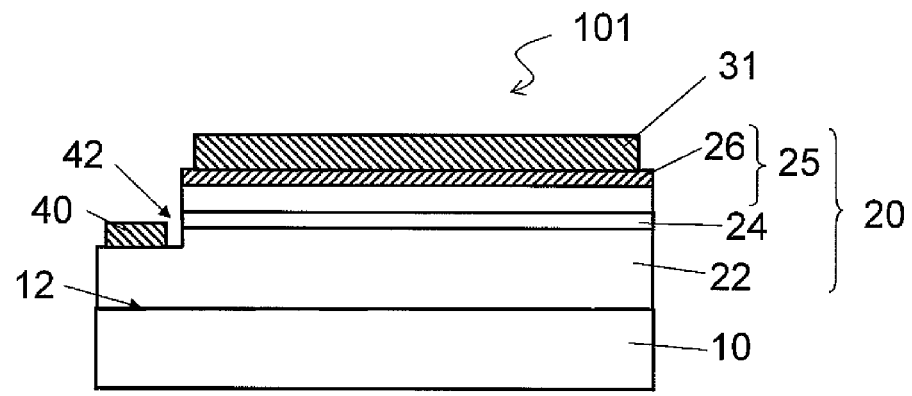
FIG. 8 is a schematic cross-sectional view of a nitride-based semiconductor light-emitting device 101 of the second embodiment.

FIG. 8 schematically shows a cross-sectional configuration of a nitride-based semiconductor light-emitting device 101 of the second embodiment. In the nitride-based semiconductor light-emitting device 101 shown in FIG. 8, an electrode 31 is formed only of an Ag layer. The other elements are the same as those of the nitride-based semiconductor light-emitting device 100 of the first embodiment, and the detailed descriptions thereof are herein omitted.

The Ag layer of the electrode 31 has a thickness of not less than 100 nm and not more than 500 nm, for example. The Ag layer may be made of an alloy whose major constituent is Ag, and to which one or more other metals (e.g., Cu, Au, Pd, Nd, Sm, Sn, In, Bi) of very small amounts are added. The Ag layer that is made of the alloy of these metals is excellent in thermal resistance and reliability, for example, as compared with Ag.

The result of measurement of the specific contact resistance of a sample of the present embodiment is now described. The sample used in this measurement was configured such that the thickness of the p-$Al_dGa_eN$ contact layer 26 was 26 μm, and the concentration profile of Mg contained in the p-$Al_dGa_eN$ contact layer 26 was equal to that of Sample No. 5 shown in FIG. 5. On the p-$Al_dGa_eN$ contact layer 26 of this sample, the electrode 31 was formed of a 100 nm thick Ag layer. It was confirmed that, in the sample of the present embodiment, the specific contact resistance of $8.0 \times 10^{-4}$ $\Omega cm^2$ to $1.0 \times 10^{-3}$ $\Omega cm^2$ was obtained. Thus, it was confirmed that, even in the present embodiment, the contact resistance was sufficiently reduced.

The inventor of the present application confirmed that, when the sample of the present embodiment with the p-$Al_dGa_eN$ contact layer 26 having been formed therein is left in the atmosphere, a layer of magnesium chloride is deposited on the surface of the p-$Al_dGa_eN$ contact layer 26 so as to have a thickness of approximately one atomic layer (0.2 nm). It is estimated that Mg contained in the p-$Al_dGa_eN$ contact layer 26 was deposited on the outermost surface side of the p-$Al_dGa_eN$ contact layer 26 at a high temperature around 950° C. (a temperature for epitaxial growth of the p-$Al_dGa_eN$ contact layer 26), and the resultant Mg layer caused a reaction with chlorine, whereby magnesium chloride was produced. Another possibility was that a phenomenon that Mg contained in the atmosphere in a reactor was deposited on the surface of the p-$Al_dGa_eN$ contact layer 26 might contribute to production of magnesium chloride. Note that observing a deposited Mg layer which is as thin as about one atomic layer with the use of a SIMS is difficult.

The thickness and form of the deposited Mg layer may vary depending on, for example, the concentration of Mg contained in the p-$Al_dGa_eN$ contact layer 26, the thickness of the p-$Al_dGa_eN$ contact layer 26, and the conditions of the heat treatment performed after the formation of the electrode 31. The deposited Mg layer may be a layer whose major constituent is Mg or may be made of an alloy of Mg and the metal of the electrode 31. Alternatively, the deposited Mg layer may contain, for example, Ga derived from the semiconductor multilayer structure 20. The deposited Mg layer may not necessarily be in the form of a layer but may be in the form of islands.

In the present embodiment, the heat treatment after the formation of the electrode 31 is performed in the presence of the deposited Mg layer. It is estimated that Ga migrates from the p-$Al_dGa_eN$ contact layer 26 to the electrode so that Ga vacancies are generated in the p-$Al_dGa_eN$ contact layer 26. Meanwhile, it is estimated that, N atoms rarely migrate to the electrode 31 side. Because of these principles, it is estimated that, the contact resistance decreases. Note that there is a probability that a deposited Mg layer is present even in a c-plane nitride-based semiconductor light-emitting device (comparative example) which was fabricated under the same conditions as those of the present embodiment except that c-plane growth was employed. However, it is estimated that, by the above-described heat treatment, not only Ga atoms but also N atoms are simultaneously diffused toward the Ag electrode side. As such, it is estimated that, in the c-plane nitride-based semiconductor light-emitting device (comparative example), high contact resistance is obtained as compared with the present embodiment (m-plane).

The fabrication method of the present embodiment is the same as that of the first embodiment except that the Ag layer is formed as the electrode 31. The Ag layer may be formed by, for example, a commonly-employed evaporation method.

In the present embodiment, the impurity concentration of the p-$Al_dGa_eN$ contact layer 26 is not less than $4 \times 10^{19}$ $cm^{-3}$ and not more than $2 \times 10^{20}$ $cm^{-3}$, and the thickness of the p-$Al_dGa_{e1}N$ contact layer 26 is not less than 26 nm and not more than 60 nm. With this configuration, the contact resistance can be sufficiently reduced.

Further, the reflectance by the electrode 31 of light generated at the active layer 24 can be improved. The reflectance of the light of Ag is high, and therefore, when reflection of light is considered, the distance from the outermost surface of the p-$Al_dGa_eN$ contact layer 26 to the Ag layer of the electrode 31 is preferably short. In the first embodiment, there is the Mg layer 32 between the Ag layer 34 of the electrode 31 and the p-$Al_dGa_eN$ contact layer 26. In the present embodiment, the distance between the Ag layer of the electrode 31 and the p-$Al_dGa_{e1}N$ contact layer 26 is reduced by the thickness of the Mg layer 32 of the first embodiment. Therefore, the reflectance of light from the active layer 24 can be improved as compared with the first embodiment.

In the present embodiment, the electrode 31 is formed of an Ag layer. The surface of the electrode 31 may be covered with a protection electrode which is made of a metal different from Ag (e.g., Ti, Pt, Mo, Pd, Au, W). To protect the electrode 31, a protection layer which is made of a dielectric (e.g., $SiO_2$, SiN) may be provided. On the above-described protection electrode or protection layer, a metal for interconnection (e.g., Au or AuSn) may be formed. The electrode 31 may be made of a metal different from Ag (e.g., Pt, Pd, Mo) or may be made of two or more types of alloys. The electrode 31 may be formed of a plurality of layers.

Third Embodiment

The inventor of the present application found that the contact resistance can be further reduced by providing a region of high Mg concentration at the outermost surface of the p-$Al_dGa_eN$ contact layer 26 in the nitride-based semiconductor light-emitting device 100 of the first embodiment. Hereinafter, the third embodiment is described with reference to the drawings. In the drawings mentioned below, for brevity of description, elements which have substantially the same function will be identified by the same reference numeral. Note that the present invention is not limited to the embodiment described below.

FIG. 9(a) is a cross-sectional view schematically showing a cross-sectional configuration of a nitride-based semiconductor light-emitting device 102 of the third embodiment. FIG. 9(b) is a cross-sectional view schematically showing, on an enlarged scale, the $Al_dGa_eN$ layer 25 and the electrode 30 of the nitride-based semiconductor light-emitting device 102.

In the nitride-based semiconductor light-emitting device 102 of the present embodiment, the p-$Al_dGa_eN$ contact layer 26 is provided in the vicinity of the outermost surface of the $Al_dGa_eN$ layer 25. The p-$Al_dGa_eN$ contact layer 26 is made of an $Al_xGa_yIn_zN$ (x+y+z=1, x≥0, y>0, z≥0) semiconductor which has a thickness of not less than 26 nm and not more than 60 nm.

The p-$Al_dGa_eN$ contact layer 26 includes a body region 26A, which contains Mg of not less than $4\times10^{19}$ $cm^{-3}$ and not more than $2\times10^{20}$ $cm^{-3}$, and a high concentration region 26B, which is in contact with the electrode 30 and which contains Mg of not less than $1\times10^{21}$ $cm^{-3}$.

In the high concentration region 26B, the Mg concentration is, for example, not more than $3.5\times10^{21}$ $cm^{-3}$. If the Mg concentration is not more than $3.5\times10^{21}$ $cm^{-3}$, excessive oxidation or chlorination of Mg can be prevented even when the nitride-based semiconductor light-emitting device 100 is left in an atmospheric environment. If the Mg concentration is not more than $3.5\times10^{21}$ $cm^{-3}$, the contact resistance is stably not more than $1\times10^{-3}$ $\Omega cm^2$ with high yield.

In FIGS. 9(a) and 9(b), the high concentration region 26B has a layered form in a portion which is in contact with the electrode 30. The high concentration region 26B may have the form of islands or may have a porous form.

The thickness of the p-$Al_dGa_eN$ contact layer 26 is not less than 26 nm and not more than 60 nm. Alternatively, it may be not less than 30 nm and not more than 45 nm. If the thickness of the p-$Al_dGa_eN$ contact layer 26 is smaller than 26 nm, the contact resistance cannot be sufficiently reduced. On the other hand, when the thickness of the p-$Al_dGa_eN$ contact layer 26 exceeds 45 nm, the bulk resistance of the p-$Al_dGa_eN$ contact layer 26 starts to increase. When nm is exceeded, the bulk resistance more conspicuously increases.

If the thickness of the body region 26A is, for example, not less than 26 nm, hole carriers injected from the electrode metal side are prevented from dissipating due to Shockley-Read-Hall recombination or leakage current in the body region 26A, so that the hole carriers can be effectively transported to the active layer. If the thickness of the body region 26A is, for example, not more than 60 nm, the value of the bulk resistance can be sufficiently decreased. In the body region 26A, the Mg concentration may be not less than $4\times10^{19}$ $cm^{-3}$ and not more than $1\times10^{20}$ $cm^{-3}$. When the Mg concentration exceeds $1\times10^{20}$ $cm^{-3}$, the bulk resistance starts to increase. Therefore, if the Mg concentration is not more than $1\times10^{20}$ $cm^{-3}$, the bulk resistance can be decreased to an especially small value.

The thickness of the high concentration region 26B is, for example, not more than 10 nm, or not more than 5 nm. If the thickness of the high concentration region 26B is not more than 10 nm, the increase of the bulk resistance is prevented. If the thickness of the high concentration region 26B is not more than 5 nm, Mg is deposited on the surface and can exhibit metal-like behavior. Due to this metal-like behavior, the effect of reducing the contact resistance, which is obtained as well in the case where a Mg metal is used as the electrode, is enhanced. That is, the effect of diffusing Ga atoms toward the electrode side is enhanced. If the thickness of the high concentration region 26B is, for example, not less than 0.5 nm, the contact resistance can surely be reduced.

In FIGS. 9(a) and 9(b), the body region 26A and the high concentration region 26B are in contact with each other. However, a transition region may be provided between the body region 26A and the high concentration region 26B. Here, the transition region refers to a region which contains Mg at a concentration that is higher than $2\times10^{20}$ $cm^{-3}$ and lower than $1\times10^{21}$ $cm^{-3}$.

The nitride-based semiconductor light-emitting device 102 has the same configuration as that of the nitride-based semiconductor light-emitting device 100 of the first embodiment except that the high concentration region 26B is provided. Here, descriptions of elements which are the same as those of the first embodiment are omitted. In the present embodiment, the electrode 31 of the second embodiment may be provided in place of the electrode 30.

Next, a method of fabricating the nitride-based semiconductor light-emitting device 102 of the present embodiment is described. Firstly, the structure is formed up to the $Al_dGa_eN$ layer 25 according to the same method as that of the first embodiment.

Then, in the upper part of the $Al_dGa_eN$ layer 25, the body region 26A is deposited as part of the p-$Al_dGa_eN$ contact layer 26. In this step, the supply of $Cp_2Mg$ is increased such that the Mg concentration of the body region 26A is higher than the Mg concentration of the other part of the $Al_dGa_eN$ layer 25.

In the case where a GaN layer which has the Mg concentration of $4\times10^{19}$ $cm^{-3}$ is formed as the body region 26A, formation of the GaN layer may be realized by, for example, supplying TMG at the flow rate of 8 sccm, $NH_3$ at the flow rate of 7.5 slm, and $Cp_2Mg$ at the flow rate of 400 sccm, while the growth temperature is maintained at 950° C. For example, when the ratio of the flow rate of the source gas of Mg to the total flow rate of the source gases (source gases for crystal and impurity) is not less than 5%, the impurity concentration of the body region 26A can be not less than $4\times10^{19}$ $cm^{-3}$.

Furthermore, on the body region 26A, the high concentration region 26B which has a thickness of about 1 nm, for example, is formed. In this step, for example, the proportion of the supply of $Cp_2Mg$ to the supply of TMG is increased such that the Mg concentration of the high concentration region 26B is higher than the Mg concentration of the body region 26A.

Specifically, for example, TMG is supplied at the flow rate of 1 sccm, $NH_3$ is supplied at the flow rate of 7.5 slm, and $Cp_2Mg$ is supplied at the flow rate of 800 sccm, while the growth temperature is at 950° C. By decreasing the flow rate of TMG, the growth rate is decreased, so that the amount of incorporated Mg increases. Also, by increasing the flow rate of Mg, the doping level of Mg can further be increased. Although depending on the configuration of the growth reactor, the growth rate, and the growth temperature, if the ratio of the flow rate of the source gas of Mg to the ratio of the total flow rate of the source gases (source gases for crystal and impurity) is not less than 10%, for example, the impurity concentration of the high concentration region 26B can be not less than $1 \times 10^{21}$ cm$^{-3}$.

The growth temperature of the p-Al$_d$Ga$_e$N contact layer 26 is preferably, for example, not less than 900° C. and not more than 1000° C. If the growth temperature is lower than 900° C., there is a problem that the crystallinity deteriorates due to the decrease of the growth rate. If the growth temperature is higher than 1000° C., absence of nitrogen may cause surface roughness.

Thereafter, the same process as that of the first embodiment is performed, whereby the nitride-based semiconductor light-emitting device 102 of the present embodiment is completed.

Figure 10:
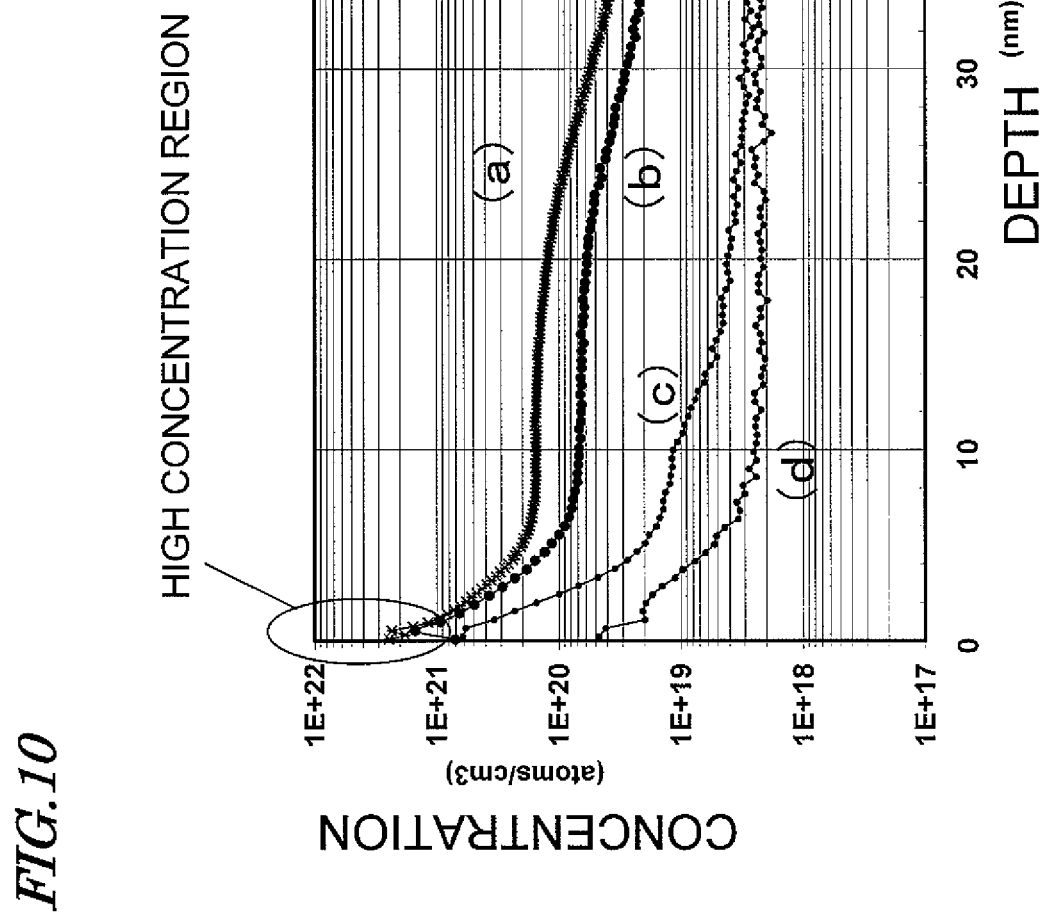
FIG. 10 is a graph showing the results of measurement of the profile of Mg atom along the depth direction with the use of a SIMS.

FIG. 10 shows the results of the profile of Mg atom along the depth direction which were obtained with the use of a SIMS. In FIG. 10, the profiles (a) and (b) of the present embodiment and the profiles (c) and (d) of the comparative example are shown.

In the profile (a), the Mg concentration at depth 0 (part of the p-Al$_d$Ga$_e$N contact layer 26 which is in contact with the electrode 30) is $2.5 \times 10^{21}$ cm$^{-3}$, and the thickness of a region which has a Mg concentration of not less than $1.0 \times 10^{21}$ cm$^{-3}$ is 1.1 nm. In the profile (b), the Mg concentration at depth 0 (part of the p-Al$_d$Ga$_e$N contact layer 26 which is in contact with the electrode 30) is $1.7 \times 10^{21}$ cm$^{-3}$, the thickness of a region which has a Mg concentration of not less than $1.0 \times 10^{21}$ cm$^{-3}$ (high concentration region 26B) is 0.8 nm. In the profiles (a) and (b), the thickness of a region which has a Mg concentration of not less than $4 \times 10^{19}$ cm$^{-3}$ (p-Al$_d$Ga$_e$N contact layer 26) is 35 nm and 29 nm, respectively.

On the other hand, in the profiles (c) and (d), the Mg concentration at depth 0 (part of the p-Al$_d$Ga$_e$N contact layer 26 which is in contact with the electrode 30) is $6 \times 10^{20}$ cm$^{-3}$ and $5 \times 10^{19}$ cm$^{-3}$, respectively. In the profiles (c) and (d), a region which has a Mg concentration of not less than $1.0 \times 10^{21}$ cm$^{-3}$ (high concentration region 26B) does not exist. In the profiles (c) and (d), the thickness of a region which has a Mg concentration of not less than $4 \times 10^{19}$ cm$^{-3}$ is about 4 nm and about 1 nm, respectively. As described above, the p-Al$_d$Ga$_e$N contact layer 26 of the present embodiment has a thickness of not less than 26 nm. Therefore, in the profiles (c) and (d), the p-Al$_d$Ga$_e$N contact layer 26 is not provided.

For the profiles (a) through (d), the contact resistance was measured using TLM (Transmission Line Method). As a result, the contact resistances of the profiles (a), (b), (c), and (d) were $3 \times 10^{-4}$ Ωcm$^2$, $4 \times 10^{-4}$ Ωcm$^2$, $2 \times 10^{-3}$ Ωcm$^2$, and $1 \times 10^{-2}$ Ωcm$^2$, respectively. In the cases of the profiles (a) and (b), the obtained contact resistances were lower than those of the profiles (c) and (d).

In the profiles (a) and (b) of FIG. 10, there is a region where the Mg concentration is higher than $2 \times 10^{20}$ cm$^{-3}$ and lower than $1 \times 10^{21}$ cm$^{-3}$ (transition region). The reasons why such a transition region is observed are that the time that is consumed between the increase of the supply proportion of Mg and actual incorporation of Mg into the crystal is long (memory effect) and that there is a measurement error of the SIMS. In the p-Al$_d$Ga$_e$N contact layer 26 of the present embodiment, such a transition region may be provided between the body region 26A and the high concentration region 26B.

Figure 11:
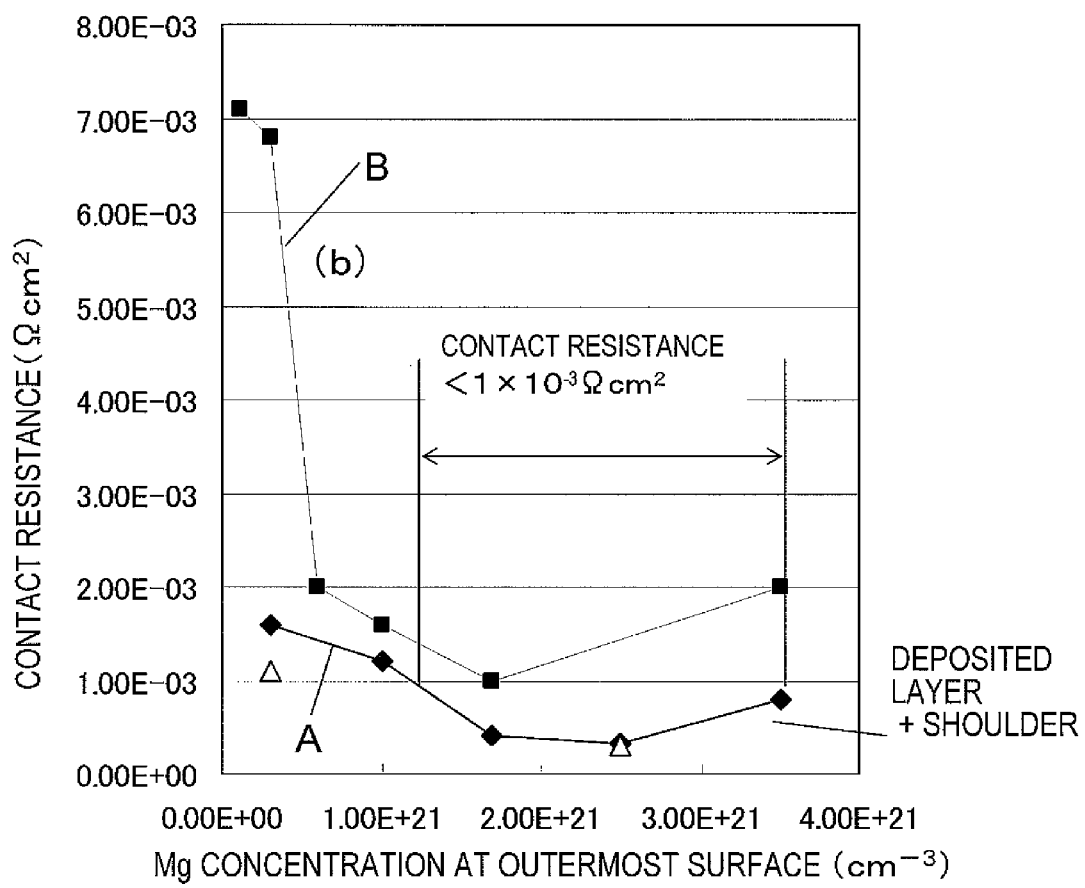
FIG. 11 is a graph showing the relationship between the impurity concentration of part of the p-$Al_dGa_eN$ contact layer 26 which is in contact with the electrode 30 and the contact resistance.
Figure 12:
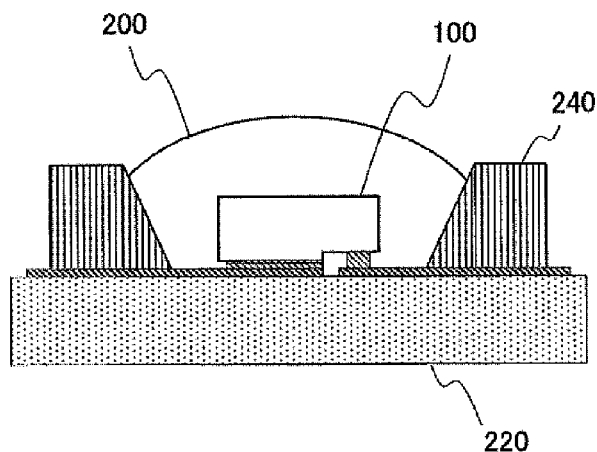
FIG. 12 is a cross-sectional view showing an embodiment of a white light source.

FIG. 11 shows the relationship between the impurity concentration of part of the p-Al$_d$Ga$_e$N contact layer 26 which is in contact with the electrode 30 (outermost surface) and the contact resistance. The profile A is a measurement result of a sample which includes the p-Al$_d$Ga$_e$N contact layer 26. In the profile A, the values represented by triangles (Δ) are values of a sample in which the thickness of the p-Al$_d$Ga$_e$N contact layer 26 is 35 nm, and the values represented by diamonds (♦) are values of a sample in which the thickness of the p-Al$_d$Ga$_e$N contact layer 26 is 30 nm. The profile B is a measurement result of a sample which does not include the p-Al$_d$Ga$_e$N contact layer 26 (comparative example). This is a case where the body region 26A rarely exists, and only the high concentration region 26B exists.

From the results shown in FIG. 11, it is seen that, when the Mg concentration of the high concentration region 26B is equal, the contact resistance can be reduced by providing the p-Al$_d$Ga$_e$N contact layer 26. Particularly, when the Mg concentration of the outermost surface was not less than $1.2 \times 10^{21}$ cm$^{-3}$ and not more than $3.6 \times 10^{21}$ cm$^{-3}$, the result showed that the contact resistance was lower than $1 \times 10^{-3}$ Ωcm$^2$.

Table 1 and Table 2 show specific values of the respective plots which form the profiles A and B. In the tables, "Thickness of Contact Layer" refers to the thickness of a region in which the Mg concentration is not less than $4 \times 10^{19}$ cm$^{-3}$.

TABLE 1

| Concentration in Uppermost Surface | Contact Resistance | Thickness of Contact Layer |
|---|---|---|
| $3.0 \times 10^{20}$ cm$^{-3}$ | $1.6 \times 10^{-3}$ Ωcm$^2$ | 29 nm |
| $1.0 \times 10^{21}$ cm$^{-3}$ | $1.2 \times 10^{-3}$ Ωcm$^2$ | 31 nm |
| $1.7 \times 10^{21}$ cm$^{-3}$ | $4.0 \times 10^{-4}$ Ωcm$^2$ | 29 nm |
| $2.5 \times 10^{21}$ cm$^{-3}$ | $3.2 \times 10^{-4}$ Ωcm$^2$ | 30 nm |
| $3.5 \times 10^{21}$ cm$^{-3}$ | $8.0 \times 10^{-4}$ Ωcm$^2$ | 31 nm |
| $3.0 \times 10^{20}$ cm$^{-3}$ | $1.1 \times 10^{-3}$ Ωcm$^2$ | 36 nm |
| $2.5 \times 10^{21}$ cm$^{-3}$ | $3.0 \times 10^{-4}$ Ωcm$^2$ | 35 nm |

TABLE 2

| Concentration in Uppermost Surface | Contact Resistance |
|---|---|
| $1.2 \times 10^{20}$ cm$^{-3}$ | $7.1 \times 10^{-3}$ Ωcm$^2$ |
| $3.0 \times 10^{20}$ cm$^{-3}$ | $6.8 \times 10^{-3}$ Ωcm$^2$ |
| $6.0 \times 10^{20}$ cm$^{-3}$ | $2.0 \times 10^{-3}$ Ωcm$^2$ |
| $1.0 \times 10^{21}$ cm$^{-3}$ | $1.6 \times 10^{-3}$ Ωcm$^2$ |
| $1.7 \times 10^{21}$ cm$^{-3}$ | $1.0 \times 10^{-3}$ Ωcm$^2$ |
| $3.5 \times 10^{21}$ cm$^{-3}$ | $2.0 \times 10^{-3}$ Ωcm$^2$ |

Another Embodiment

The above-described light-emitting device of an embodiment could be used as it is as a light source. However, if the light-emitting device of the embodiment is combined with a resin including a phosphoric material that produces wavelength conversion, for example, the device of the present disclosure can be used effectively as a light source with an expanded operating wavelength range (such as a white light source).

Figure 9:
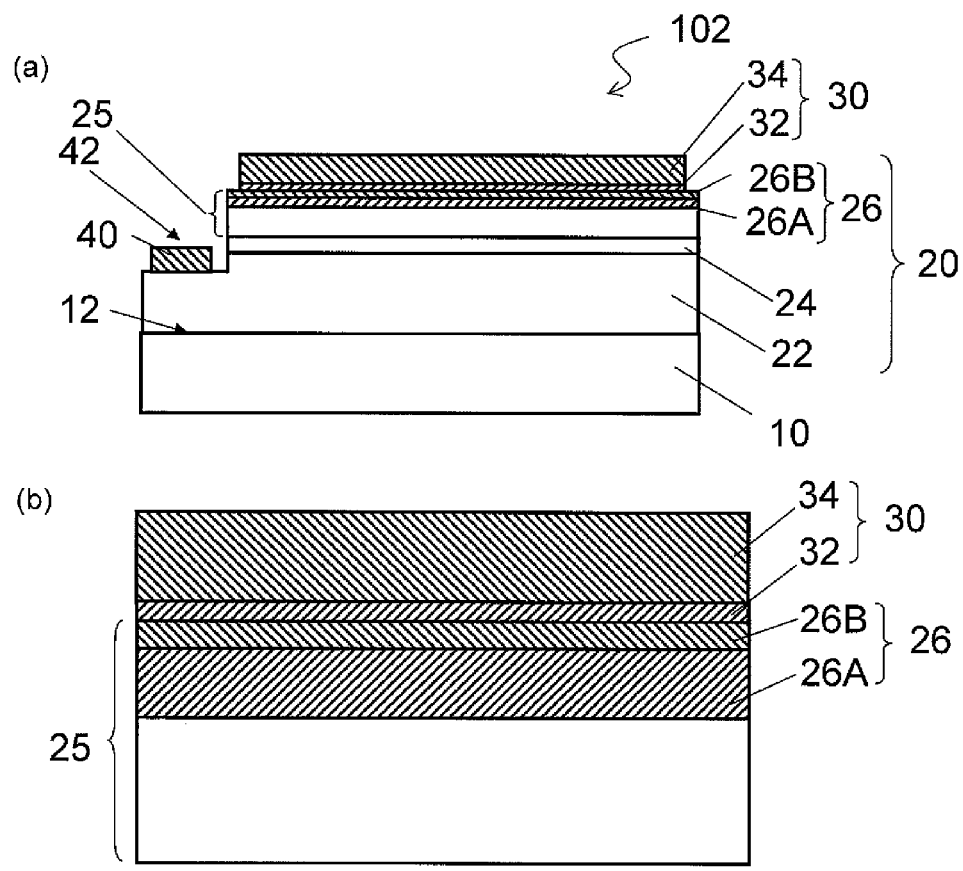
FIG. 9(a) is a cross-sectional view schematically showing a cross-sectional configuration of a nitride-based semiconductor light-emitting device 102 of the third embodiment.
FIG. 9(b) is a cross-sectional view schematically showing, on an enlarged scale, the $Al_dGa_eN$ layer 25 and the electrode 30 of the nitride-based semiconductor light-emitting device 102.

FIG. 9 is a schematic representation illustrating an example of such a white light source. The light source shown in FIG. 9 includes a light-emitting device 100 with the structure shown in FIG. 3(a) and a resin layer 200 in which particles of a phosphor such as YAG (yttrium aluminum garnet) are dispersed to change the wavelength of the light emitted from the light-emitting device 100 into a longer one. The light-emitting device 100 is mounted on a supporting member 220 on which a wiring pattern has been formed. And on the supporting member 220, a reflective member 240 is arranged so as to surround the light-emitting device 100. The resin layer 200 has been formed so as to cover the light-emitting device 100.

In the embodiments described above, the p-type semiconductor region that is in contact with the electrode 30 is supposed to be made of GaN or AlGaN. However, the p-type semiconductor region could also be a layer including In such as InGaN. In that case, the contact layer to be in contact with the electrode 30 could be made of $In_{0.2}Ga_{0.8}N$ with an In mole fraction of 0.2, for example. If In is included in GaN, the bandgap of $Al_aGa_bN$ layer (where a+b=1, a≥0, b>0) can be smaller than that of GaN, and therefore, the contact resistance can be reduced as a result. Consequently, the p-type semiconductor region (p-$Al_dGa_eN$ contact layer 26) that is in contact with the Mg layer may be made of an $Al_xGa_yIn_zN$ semiconductor (where x+y+z=1, x≥0, y>0 and z≥0). Note that the light-emitting device 101 shown in FIG. 8 may be used for the white light source shown in FIG. 9.

The effect of reducing the contact resistance can naturally be achieved by a non-LED light-emitting device (such as a semiconductor laser diode) or a device other than a light-emitting device (such as a transistor or a photodetector).

An actual surface called "m-plane" does not need to be perfectly parallel to the m-plane but may be inclined from the m-plane by an angle. The angle of the inclination is defined by an angle formed by the normal to the actual principal surface of the nitride semiconductor layer and the normal to the m-plane (m-plane without inclination). The actual principal surface can be inclined from the m-plane (m-plane without inclination) in the direction of a vector which is represented by the c-axis direction and the a-axis direction. The absolute value of the inclination angle θ may be not more than 5°, preferably not more than 1°, in the c-axis direction. In the a-axis direction, the absolute value of the inclination angle θ may be not more than 5°, preferably not more than 1°. Specifically, in the present invention, the "m-plane" includes a plane which is inclined from the m-plane (m-plane without inclination) in a direction by an angle in the range of ±5°. Within such a range of the inclination angle, the principal surface of the nitride semiconductor layer, as a whole, is inclined from the m-plane. However, upon closer observation, a large number of m-plane regions are exposed over the principal surface. Thus, it is expected that a plane which is inclined from the m-plane by an angle of not more than 5° (absolute value) has the same characteristics as those of the m-plane. When the absolute value of the inclination angle θ is greater than 5°, the internal quantum efficiency may decrease due to a piezoelectric field. Therefore, the absolute value of the inclination angle θ is set to 5° or smaller.

In the first through third embodiments, the $Al_dGa_eN$ layer 25 and the p-$Al_dGa_eN$ contact layer 26 are doped with Mg as the p-type impurity. However, according to the present disclosure, other examples of the p-type dopant than Mg include Zn and Be.

The nitride-based semiconductor light-emitting devices of the first through third embodiments may be realized by, for example, a light-emitting diode or a laser diode that operates at wavelengths over the ultraviolet range and the entire visible radiation range, which covers blue, green, orange and white parts of the spectrum.

INDUSTRIAL APPLICABILITY

The present subject matter is particularly useful in the fields of technologies including display, illumination and optical information processing.

| REFERENCE SIGNS LIST | |
|---|---|
| 10 | substrate (GaN-based substrate) |
| 12 | surface of substrate (m-plane) |
| 20 | semiconductor multilayer structure |
| 22 | $Al_uGa_vIn_wN$ layer |
| 24 | active layer |
| 25 | $Al_dGa_eN$ layer |
| 26 | p-$Al_dGa_eN$ contact layer |
| 26A | body region |
| 26B | high concentration region |
| 30, 30A, 30B, 30C, 31 | p-electrode |
| 32 | Mg layer |
| 34 | Ag layer |
| 100, 101, 102 | nitride-based semiconductor light-emitting device |
| 200 | resin layer |
| 220 | supporting member |
| 240 | reflective member |

The invention claimed is:

1. A nitride-based semiconductor device, comprising:
a nitride-based semiconductor multilayer structure including a p-type semiconductor region, a growing plane of the p-type semiconductor region being an m-plane; and
an electrode that is provided on the p-type semiconductor region,
wherein the p-type semiconductor region includes a contact layer which is made of an $Al_xGa_yIn_zN$ (x+y+z=1, x≥0, y≥0, z≥0) semiconductor, the contact layer having a thickness of not less than 26 nm and not more than 60 nm,
the contact layer includes a body layer which contains Mg of not less than $4\times10^{19}$ cm$^{-3}$ and not more than $2\times10^{20}$ cm$^{-3}$ and a high-concentration layer which is in contact with the electrode and which has a Mg concentration of not less than $1\times10^{21}$ cm$^{-3}$,
the high-concentration layer has a thickness of not less than 0.5 nm and not more than 5 nm, and
a magnesium layer is deposited on a surface of the high-concentration layer.

2. The nitride-based semiconductor device of claim 1, wherein the contact layer includes a transition region between the body layer and the high-concentration layer, the transition region containing Mg at a concentration which is higher than $2\times10^{20}$ cm$^{-3}$ and lower than $1\times10^{21}$ cm$^{-3}$.

3. The nitride-based semiconductor device of claim 1, wherein the body layer contains Mg of not less than $4\times10^{19}$ cm$^{-3}$ and not more than $1\times10^{20}$ cm$^{-3}$.

4. The nitride-based semiconductor device of claim 1, wherein part of the electrode which is in contact with the high-concentration layer is a first layer which contains at least any one of Mg, Zn, and Ag.

5. The nitride-based semiconductor device of claim 4, wherein the electrode includes a second layer provided on the first layer.

6. The nitride-based semiconductor device of claim 5, wherein the second layer is made of at least one metal selected from a group consisting of Ag, Pt, Mo, and Pd.

7. The nitride-based semiconductor device of claim 4, wherein the first layer is in a form of islands.

8. The nitride-based semiconductor device of claim 1, wherein the electrode is a Ag layer.

9. The nitride-based semiconductor device of claim 1, wherein the p-type semiconductor region further includes a p-type semiconductor layer which is made of an $Al_xGa_yIn_zN$ (x+y+z=1, x≥0, y≥0, z≥0) semiconductor that contains Mg of not less than $1\times10^{18}$ cm$^{-3}$ and not more than $1\times10^{19}$ cm$^{-3}$.

10. The nitride-based semiconductor device of claim 9, wherein the thickness of the p-type semiconductor region is not less than 100 nm and not more than 500 nm.

11. A light source, comprising:
a nitride-based semiconductor light-emitting device according to claim 1; and
a wavelength conversion section including a phosphoric material that converts a wavelength of light emitted from the nitride-based semiconductor light-emitting device.

12. The light source of claim 11, wherein the contact layer includes a transition region between the body layer and the high-concentration layer, the transition region containing Mg at a concentration which is higher than $2\times10^{20}$ cm$^{-3}$ and lower than $1\times10^{21}$ cm$^{-3}$.

13. The light source of claim 11, wherein the body layer contains Mg of not less than $4\times10^{19}$ cm$^{-3}$ and not more than $1\times10^{20}$ cm$^{-3}$.

* * * * *